United States Patent
Oh et al.

(10) Patent No.: US 12,400,898 B2
(45) Date of Patent: *Aug. 26, 2025

(54) SUBSTRATE FOR MANUFACTURING DISPLAY DEVICE AND METHOD FOR MANUFACTURING DISPLAY DEVICE

(71) Applicant: LG ELECTRONICS INC., Seoul (KR)

(72) Inventors: Donghae Oh, Seoul (KR); Changseo Park, Seoul (KR); Jin Hyung Lee, Seoul (KR); Changhyun Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 728 days.

This patent is subject to a terminal disclaimer.

(21) Appl. No.: 17/620,533

(22) PCT Filed: Jul. 2, 2019

(86) PCT No.: PCT/KR2019/008009
§ 371 (c)(1),
(2) Date: Dec. 17, 2021

(87) PCT Pub. No.: WO2020/256207
PCT Pub. Date: Dec. 24, 2020

(65) Prior Publication Data
US 2022/0359257 A1    Nov. 10, 2022

(30) Foreign Application Priority Data

Jun. 20, 2019  (KR) ........................ 10-2019-0073651

(51) Int. Cl.
*H01L 21/683* (2006.01)
*H01L 25/075* (2006.01)
(Continued)

(52) U.S. Cl.
CPC ...... *H01L 21/6835* (2013.01); *H01L 25/0753* (2013.01); *H10H 20/857* (2025.01);
(Continued)

(58) Field of Classification Search
CPC ... H01L 2224/03003; H01L 2224/0344; H01L 2224/11033; H01L 2224/1144; H01L 2224/27003; H01L 2224/95115
See application file for complete search history.

(56) References Cited

U.S. PATENT DOCUMENTS 6,536,106 B1    3/2003   Jackson et al.
2001/0003049 A1  6/2001   Fukasawa et al.
(Continued)

FOREIGN PATENT DOCUMENTS

KR   10-2013-0033450 A    4/2013
KR   10-2017-0022756 A    3/2017
(Continued)

OTHER PUBLICATIONS

O'Riordan et al., "Field Configured Assembly: Programmed Manipulation and Self-assembly at the Mesoscale", Nano Letters 2004, 4, 5, 761-765 (Year: 2004).*
(Continued)

*Primary Examiner* — Joshua Benitez Rosario
*Assistant Examiner* — Moataz Khalifa
(74) *Attorney, Agent, or Firm* — Birch, Stewart, Kolasch & Birch, LLP

(57) ABSTRACT

Discussed is an assembly substrate used in a display manufacturing method for placing semiconductor light-emitting devices to predetermined positions thereof using an electric field and a magnetic field, the assembly substrate including a base part; a plurality of assembly electrodes extending in one direction and disposed in parallel on the base part; a dielectric layer disposed on the base part to cover the
(Continued)

plurality of assembly electrodes; and partition walls disposed on the dielectric layer and defining cells at predetermined intervals along the one direction of the plurality of assembly electrodes so as to overlap portions of the plurality of assembly electrodes, and the semiconductor light-emitting devices being placed into the cells, respectively, wherein a protrusion part protrudes inward from at least one of inner surfaces of each of the cells.

19 Claims, 16 Drawing Sheets

(51) Int. Cl.
*H10H 20/01* (2025.01)
*H10H 20/857* (2025.01)

(52) U.S. Cl.
CPC ............ *H01L 2221/68313* (2013.01); *H01L 2221/68354* (2013.01); *H01L 2221/68368* (2013.01); *H10H 20/0364* (2025.01)

(56) References Cited

U.S. PATENT DOCUMENTS

| | | | |
|---|---|---|---|
| 2003/0183904 A1 | 10/2003 | Fonstad, Jr. et al. | |
| 2003/0186469 A1 | 10/2003 | Fonstad, Jr. et al. | |
| 2010/0101700 A1* | 4/2010 | Liang | B32B 27/40 156/73.6 |
| 2011/0180818 A1* | 7/2011 | Lerman | H01L 25/0753 257/88 |
| 2018/0204973 A1 | 7/2018 | Jeung et al. | |
| 2019/0088524 A1 | 3/2019 | Lee et al. | |

FOREIGN PATENT DOCUMENTS

| | | |
|---|---|---|
| KR | 10-2018-0009014 A | 1/2018 |
| KR | 10-2018-0030454 A | 3/2018 |
| KR | 10-2018-0030455 A | 3/2018 |
| KR | 10-2018-0081378 A | 7/2018 |
| KR | 10-2018-0086945 A | 8/2018 |
| KR | 10-2018-0117004 A | 10/2018 |
| KR | 10-2019-0009045 A | 1/2019 |
| WO | WO 2019/017670 A1 | 1/2019 |

OTHER PUBLICATIONS

Smith et al., "Electric-field assisted assembly and alignment of metallic nanowires", Appl. Phys. Lett., vol. 77, No. 9, Aug. 28, 2000, 1399-1401 (Year: 2000).*

* cited by examiner (a)

(b)

(c)

(d)

SUBSTRATE FOR MANUFACTURING DISPLAY DEVICE AND METHOD FOR MANUFACTURING DISPLAY DEVICE

CROSS REFERENCE TO RELATED APPLICATIONS

This application is the National Stage filing under 35 U.S.C. 371 of International Application No. PCT/KR2019/008009, filed on Jul. 2, 2019, which claims the benefit of earlier filing date and right of priority to Korean Application No. 10-2019-0073651, filed on Jun. 20, 2019, the contents of all these applications are hereby incorporated by reference herein in their entirety.

TECHNICAL FIELD

The present disclosure relates to an assembly substrate used in a method for manufacturing a display device and a method for manufacturing a display device using a semiconductor light emitting device with a size of several to tens of μm.

BACKGROUND ART

The current competing technologies for large area display are liquid crystal displays (LCDs), organic light-emitting diode (OLED) displays, micro-LED displays, and the like.

However, there exist problems such as not-so-fast response time and low efficiency of light generated by backlight in the case of the LCDs, and there exist drawbacks such as a short lifespan, not-so-good yield, and low efficiency in the case of the OLEDs.

The use of semiconductor light-emitting diodes (micro-LEDs (μLEDs)) with a diameter or cross-sectional area of 100 microns or less in a display may provide very high efficiency because the display does not use a polarizer to absorb light. However, since a large display requires millions of LEDs, it has difficulty in transferring the LEDs compared to other technologies.

Pick and place, laser lift-off (LLO), self-assembly, and the like have been developed for transfer techniques. Among them, the self-assembly technique, which is a method in which semiconductor light-emitting diodes are self-organized in a fluid, is the most suitable method for realizing a large screen display device.

The self-assembly may include a method of directly assembling semiconductor light-emitting devices to a final substrate (or wiring substrate) in which wiring is formed, and a method of assembling semiconductor light-emitting devices on an assembly substrate and then transferring the semiconductor light-emitting devices to a final substrate through an additional transfer process. Both the two methods are selectively used as they have their own advantages. For example, the former is efficient in the process perspective, and the latter is advantageous in that a structure for the self-assembly can be added without limitation.

DISCLOSURE OF INVENTION

Technical Problem

The present disclosure describes an assembly substrate having a structure that can improve a transfer rate in a process of transferring semiconductor light-emitting devices seated on an assembly substrate, which is a substrate for manufacturing a display device, to a transfer substrate, and a method for manufacturing a display device.

Solution to Problem

According to one aspect of the subject matter described in this application, there is provided an assembly substrate used in a display manufacturing method for placing semiconductor light-emitting devices to predetermined positions of the assembly substrate using an electric field and a magnetic field. The assembly substrate includes: a base part; a plurality of assembly electrodes extending in one direction and disposed in parallel on the base part; a dielectric layer disposed on the base part to cover the plurality of assembly electrodes; and partition walls disposed on the dielectric layer and defining cells at predetermined intervals along the extension direction of the plurality of assembly electrodes so as to overlap portions of the plurality of assembly electrodes, semiconductor light-emitting devices being placed into the cells, respectively. A protrusion part protrudes inward from at least one of inner surfaces of each of the cells.

Implementations according to this aspect may include one or more of the following features. For example, the protrusion part may include a plurality of protrusions, and at least a part of the plurality of protrusions may be in contact with the semiconductor light-emitting device placed into the cell.

In some implementations, the protrusion part may be formed on at least an upper surface of the dielectric layer among the inner surfaces of the cell.

In some implementations, the protrusion part may be made of a material the same as a material defining the inner surfaces of the cell on which the protrusion part is formed.

In some implementations, the protrusion part may be made of a material having a smaller contact force than a material defining the inner surfaces of the cell on which the protrusion part is formed with respect to the semiconductor light-emitting device.

According to another aspect, there is provided an assembly substrate used in a display manufacturing method for placing semiconductor light-emitting devices to predetermined positions of the assembly substrate using an electric field and a magnetic field. The assembly substrate includes: a base part; a plurality of assembly electrodes extending in one direction and disposed in parallel on the base part; a dielectric layer disposed on the base part to cover the plurality of assembly electrodes; and partition walls disposed on the dielectric layer and defining cells at predetermined intervals along the extension direction of the assembly electrodes so as to overlap portions of the plurality of assembly electrodes, semiconductor light-emitting devices being placed into the cells, respectively. At least one of inner surfaces of each of the cells includes a functional layer made of a material having a smaller contact force than a material defining the inner surfaces of the cell with respect to the semiconductor light-emitting device.

Implementations according to this aspect may include one or more of the following features. For example, the functional layer may be formed on at least an upper surface of the dielectric layer among the inner surfaces of the cell.

In some implementations, the functional layer may include a protrusion part protruding therefrom to an inside of the cell.

In some implementations, the protrusion part may be made a material the same as a material defining the functional layer on which the protrusion part is formed.

In some implementations, a protrusion part may protrude inward from at least one of the inner surfaces of the cell, and the functional layer may be formed on the protrusion part.

According to another aspect, there is provided a method of manufacturing a display device. The method includes: moving the assembly substrate according to claim 1 to an assembly position and putting a plurality of semiconductor light-emitting devices including magnetic materials into a fluid chamber; applying a magnetic force to the semiconductor light-emitting devices put into the fluid chamber to cause the semiconductor light-emitting devices to move in one direction; applying an electric field to the semiconductor light-emitting devices to guide the semiconductor light-emitting devices to predetermined positions while moving such that the semiconductor light-emitting devices are placed at the predetermined positions of the assembly substrate; transferring the semiconductor light-emitting devices placed at the predetermined positions to a transfer substrate; and transferring the semiconductor light-emitting devices seated on the transfer substrate to a final substrate in which wiring is formed. The semiconductor light-emitting devices are placed into cells on the assembly substrate, respectively, and each of the cells includes at least one of a protrusion part protruding inward from one of inner surfaces thereof, and a functional layer made of a material having a smaller contact force than a material defining the inner surfaces of the cell with respect to the semiconductor light-emitting device.

Advantageous Effects of Invention

In accordance with the detailed description, structural features or characteristics of an assembly substrate used for manufacturing a display device allow a contact force between the assembly substrate and semiconductor light-emitting devices seated on the assembly substrate to be reduced, thereby increasing the transfer rate of the semiconductor light-emitting devices to a transfer substrate.

In detail, when the assembly substrate includes a protrusion part protruding from an inner surface of a cell toward an inner space of the cell, an area in contact with the semiconductor light-emitting devices is reduced. Accordingly, a contact force between the assembly substrate and the semiconductor light-emitting devices can be reduced to thereby increase the transfer rate of the semiconductor light-emitting devices.

In addition, when the assembly substrate includes a functional layer made of a material whose contact force with respect to the semiconductor light-emitting device is smaller than that of a material defining the inner surface of the cell, energy acting on a contact surface between the assembly substrate and the semiconductor light-emitting devices can be reduced, allowing a contact force of the semiconductor light-emitting devices with respect to the assembly substrate to be reduced. Thus, the transfer rate of the semiconductor light-emitting devices can be improved.

MODE FOR THE INVENTION

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present invention is not limited by the accompanying drawings. It will be understood that when an element such as a layer, area or substrate is referred to as being "on" another element, it can be directly on the element, or one or more intervening elements may also be present.

A display device disclosed herein may include a mobile phone, a smart phone, a laptop computer, a digital broadcast terminal, a personal digital assistant (PDA), a portable multimedia player (PMP), a navigator, a slate PC, a tablet PC, an ultrabook, a digital TV, a desktop computer, and the like. However, it would be readily apparent to those skilled in the art that the configuration according to the implementations described herein may also be applied to a new product type of display device that will be developed later.

Figure 1:
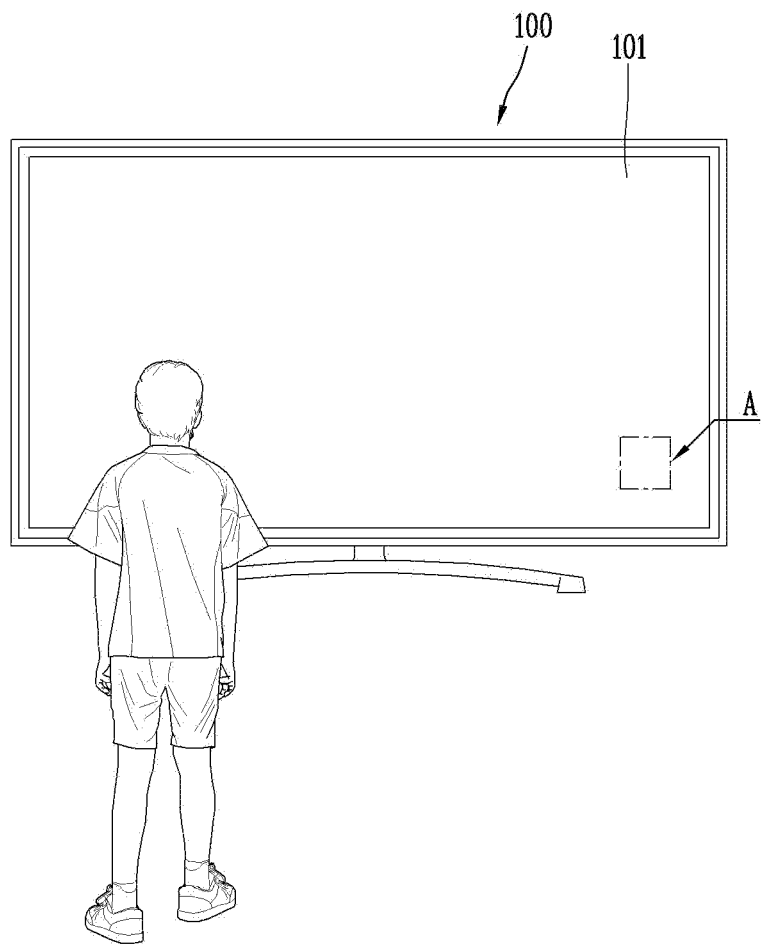
FIG. 1 is a conceptual view illustrating a display device using a semiconductor light-emitting device (diode) according to one implementation of the present disclosure.
Figure 2:
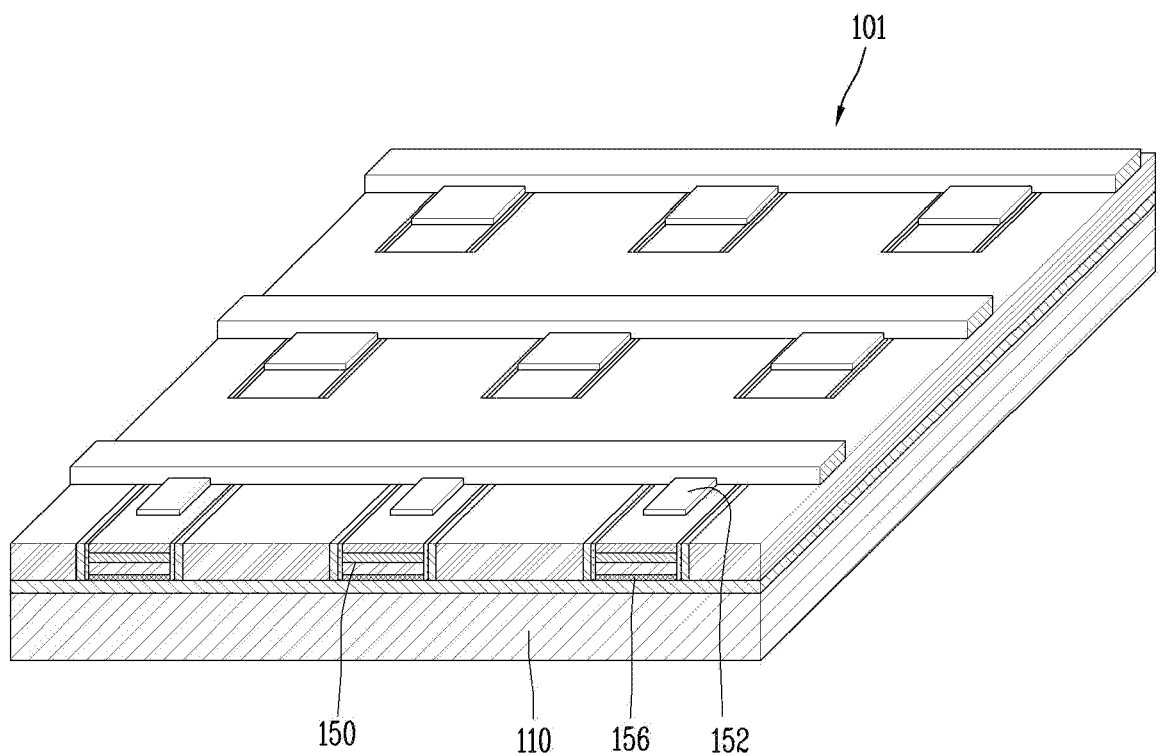
FIG. 2 is an enlarged view of a portion "A" of the display device in FIG. 1.
Figure 3:
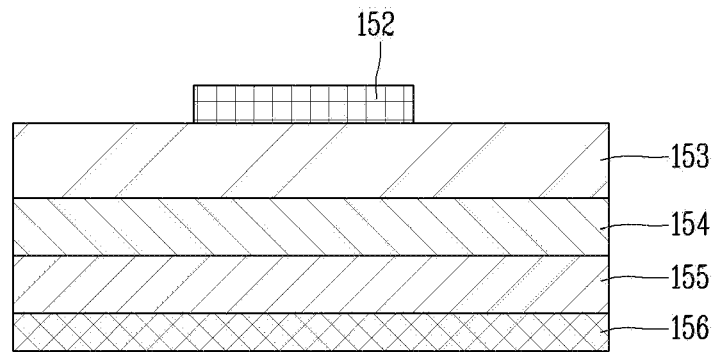
FIG. 3 is an enlarged view of a semiconductor light-emitting device of FIG. 2.
Figure 4:
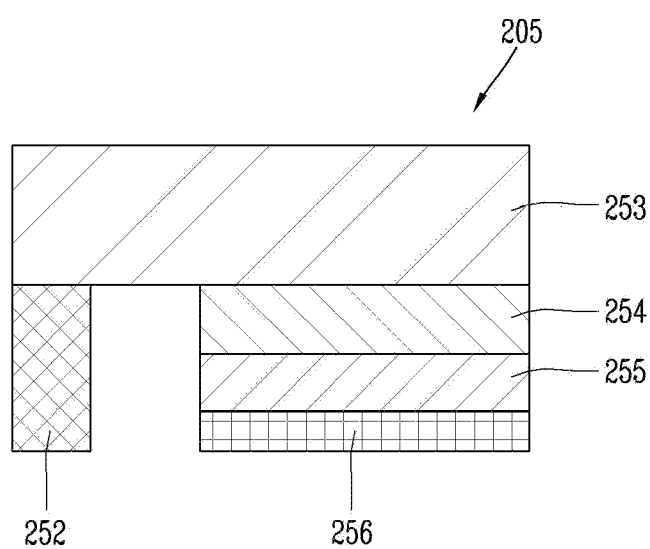
FIG. 4 is an enlarged view illustrating another implementation of a semiconductor light-emitting device of FIG. 2.

FIG. 1 is a conceptual view illustrating a display device using a semiconductor light-emitting device (diode) according to one implementation of the present disclosure, FIG. 2 is an enlarged view of a portion "A" of the display device in FIG. 1, FIG. 3 is an enlarged view of a semiconductor light-emitting device of FIG. 2, and FIG. 4 is an enlarged view illustrating another implementation of a semiconductor light-emitting device of FIG. 2.

As illustrated, information processed in a control unit (or controller) of a display device 100 may be displayed on a display module 140. A case with a closed-loop shape surrounding an edge of the display module 140 may form a bezel of the display device 100.

The display module 140 may include a panel 141 on which an image is displayed, and the panel 141 may include semiconductor light-emitting devices 150 with a micro size and a wiring substrate (or wiring board) 110 on which the semiconductor light-emitting devices 150 are mounted.

A wiring is formed on the wiring substrate 110 so as to be connected to an n-type electrode 152 and a p-type electrode 156 of the semiconductor light-emitting device 150. This may allow the semiconductor light-emitting devices 150 to be provided on the wiring substrate 110 as self-emitting individual pixels.

An image displayed on the panel 141 is visual information, which is achieved by independently controlling light emission of sub-pixels arranged in the form of matrix through the wiring.

The present disclosure exemplarily illustrates a micro light-emitting diode (micro-LED) as one type of the semiconductor light-emitting device 150 that converts current into light. The micro-LED may be a light-emitting diode with a small size of 100 microns or less. The semiconductor light-emitting devices 150 may be provided in blue, red, and green light-emitting regions, respectively, to define a sub-pixel by a combination thereof. That is, the sub-pixel denotes a minimum unit for realizing one color, and at least three micro-LEDs may be provided in the sub-pixel.

More specifically, the semiconductor light emitting device 150 may have a vertical structure as illustrated in FIG. 3.

For example, each of the semiconductor light-emitting devices 150 may be implemented as a high-power light-emitting device that emits various light colors including blue in a manner that gallium nitride (GaN) is mostly used, and indium (In) and/or aluminum (Al) are added thereto.

The vertical type semiconductor light-emitting device may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. Here, the p-type electrode 156 located at the bottom may be electrically connected to a p-electrode of the wiring substrate 110, and the n-type electrode 152 located at the top may be electrically connected to an n-electrode at an upper side of the semiconductor light-emitting device. The electrodes may be disposed in an up and down direction in the vertical type semiconductor light-emitting device 150 to thereby provide a great advantage of reducing the chip size.

Alternatively, referring to FIG. 4, the semiconductor light-emitting device may be a flip chip type light-emitting device.

For example, a semiconductor light-emitting device 205 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 disposed on the n-type semiconductor layer 253 with being spaced apart from the p-type electrode 256 in a horizontal direction. Here, both the p-type electrode 256 and the n-type electrode 252 may be electrically connected to the p-electrode and the n-electrode of the wiring substrate 110 at the bottom of the semiconductor light-emitting device 205.

Each of the vertical type semiconductor light-emitting device and the horizontal type semiconductor light-emitting device may be a green semiconductor light-emitting device, a blue semiconductor light-emitting device, or a red semiconductor light-emitting device. The green semiconductor light-emitting device and the blue semiconductor light-emitting device may each be implemented as a high-power light-emitting device that emits green or blue light in a manner that gallium nitride (GaN) is mostly used, and indium (In) and/or aluminum (Al) are added thereto. As an example, the semiconductor light-emitting device may be a gallium nitride thin film consisting of various layers such as n-Gan, p-Gan, AlGaN, InGan, and the like. More specifically, the p-type semiconductor layer may be P-type GaN, and the n-type semiconductor layer may be N-type GaN. In the case of the red semiconductor light-emitting device, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the semiconductor light-emitting devices described above may be semiconductor light-emitting devices without an active layer.

Referring to FIGS. 1 to 4, since the light-emitting diode is very small, the display panel may be configured such that self-emitting sub-pixels are arranged at fine pitch, thereby achieving a high-definition display device.

In a display device using the semiconductor light-emitting devices of the present disclosure, a semiconductor light-emitting device grown on a wafer and formed by mesa and isolation is used as an individual pixel. Here, the semiconductor light-emitting device 150 with the micro size should be transferred onto the wafer at a predetermined position on the substrate of the display panel. Pick and place is one example of those transfer techniques, which has a low success rate and requires much time. As another example, a technique of transferring several devices at once using a stamp or a roll can be used, which is poor in yield and is not suitable for a large screen display. Therefore, the present disclosure provides a new method for manufacturing a display device that can address these problems and a manufacturing device therefor.

A new method for manufacturing a display device will be described first. FIGS. 5A to 5E are conceptual views illustrating a new process of fabricating the semiconductor light-emitting device described above.

The present disclosure exemplarily illustrates a display device using a passive matrix (PM) type semiconductor light-emitting device. However, an example described hereinafter may also be applied to an active matrix (AM) type semiconductor light-emitting device. In addition, the present disclosure exemplarily illustrates self-assembly of horizontal semiconductor light-emitting devices, but it is equally applicable to self-assembly of vertical semiconductor light-emitting devices.

Figure 5A:
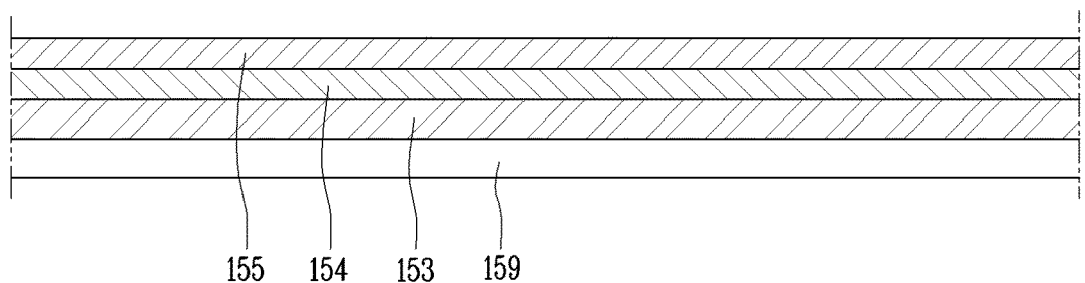
FIGS. 5A to 5E are conceptual views illustrating a new process of fabricating the semiconductor light-emitting device.

According to a manufacturing method, a first conductive semiconductor layer 153, an active layer 154, and a second conductive semiconductor layer 155 are grown on a growth substrate 159 (FIG. 5A).

When the first conductive semiconductor layer 153 is grown, the active layer 154 is grown on the first conductive semiconductor layer 153, then the second conductive semiconductor layer 155 is grown on the active layer 154. As such, when the first conductive semiconductor layer 153, the active layer 154, and the second conductive semiconductor layer 155 are sequentially grown, the first conductive semiconductor layer 153, the active layer 154, and the second conductive semiconductor layer 155 form a layered structure as illustrated in FIG. 5A.

Here, the first conductive semiconductor layer 153 may be a p-type semiconductor layer, and the second conductive semiconductor layer 155 may be an n-type semiconductor layer. However, the present disclosure is not necessarily limited thereto, and the first conductive semiconductor layer 153 may be an n-type semiconductor layer, and the second conductive semiconductor layer 155 may be a p-type semiconductor layer.

In addition, this implementation exemplarily illustrates a case in which the active layer 154 is present. However, in some cases, a structure without the active layer 154 is also possible as described above. For example, the p-type semiconductor layer may be P-type GaN doped with Mg, and the n-type semiconductor layer may be N-type GaN doped with Si.

The growth substrate (wafer) may be formed of a material having optical transparency (or transmittance), such as sapphire (Al2O3), GaN, ZnO, and AlO, but the present disclosure is not limited thereto. In addition, the growth substrate 159 may be made of a material suitable for growing a semiconductor material, namely, a carrier wafer. The growth substrate 159 may be formed of a material having high thermal conductivity, and use, for example, a SiC substrate having higher thermal conductivity than a sapphire (Al2O3) substrate, or Si, GaAs, GaP, and InP, in addition to a conductive substrate or an insulating substrate.

Figure 5B:
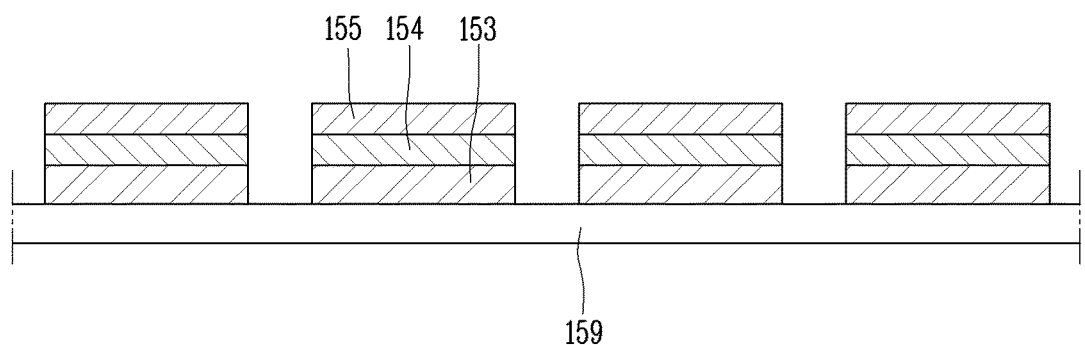

Next, at least portions or parts of the first conductive semiconductor layer 153, the active layer 154, and the second conductive semiconductor layer 155 are removed to form a plurality of semiconductor light-emitting devices (FIG. 5B).

More specifically, isolation is carried out such that the plurality of light-emitting devices form an array of light-emitting devices. That is, the first conductive semiconductor layer 153, the active layer 154, and the second conductive semiconductor layer 155 are etched in a vertical direction to form a plurality of semiconductor light-emitting devices.

In case the horizontal type semiconductor light-emitting device is formed in this step, the active layer 154 and the second conductive semiconductor layer 155 may be partially removed in the vertical direction to perform a mesa process in which the first conductive semiconductor layer 153 is exposed to the outside, and then an isolation process in which the first conductive semiconductor layer 153 is etched to form a plurality of semiconductor light-emitting device arrays.

Figure 5C:
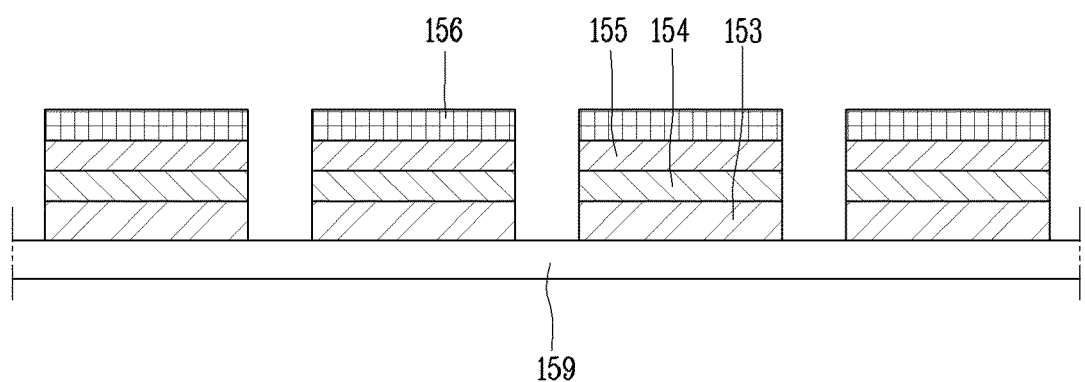

Next, a second conductive electrode 156 or p-type electrode is formed on one surface of each of the second conductive semiconductor layers 155 (FIG. 5C). The second conductive electrode 156 may be formed by a deposition method such as sputtering, but the present disclosure is not limited thereto. However, when the first conductive semiconductor layer 153 and the second conductive semiconductor layer 155 are an n-type semiconductor layer and a p-type semiconductor layer, respectively, the second conductive electrode 156 may be an n-type electrode.

Figure 5D:
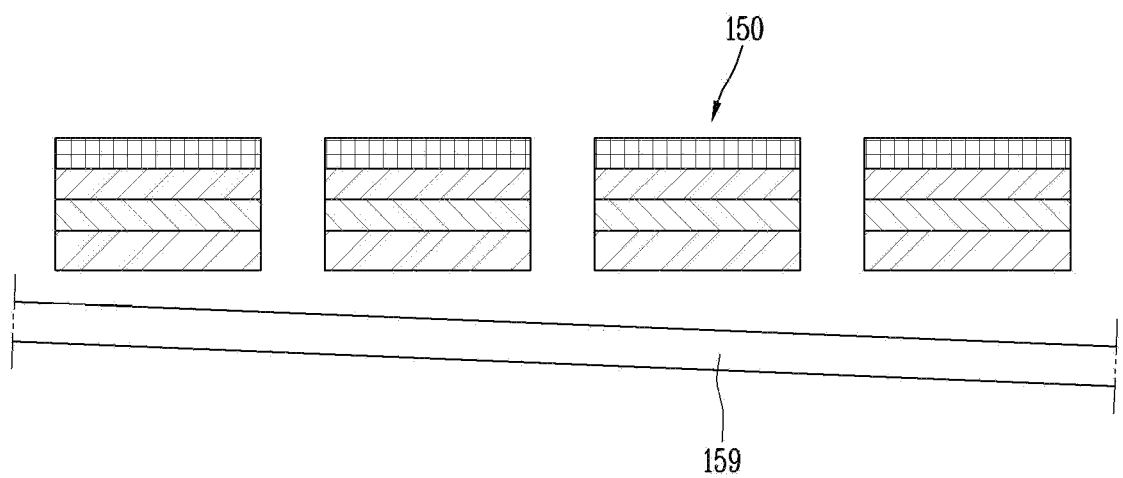

Then, the growth substrate 159 is removed to have the plurality of semiconductor devices. For example, the growth substrate 159 may be removed using a laser lift-off (LLO) or chemical lift-off (CLO) method (FIG. 5D).

Figure 5E:
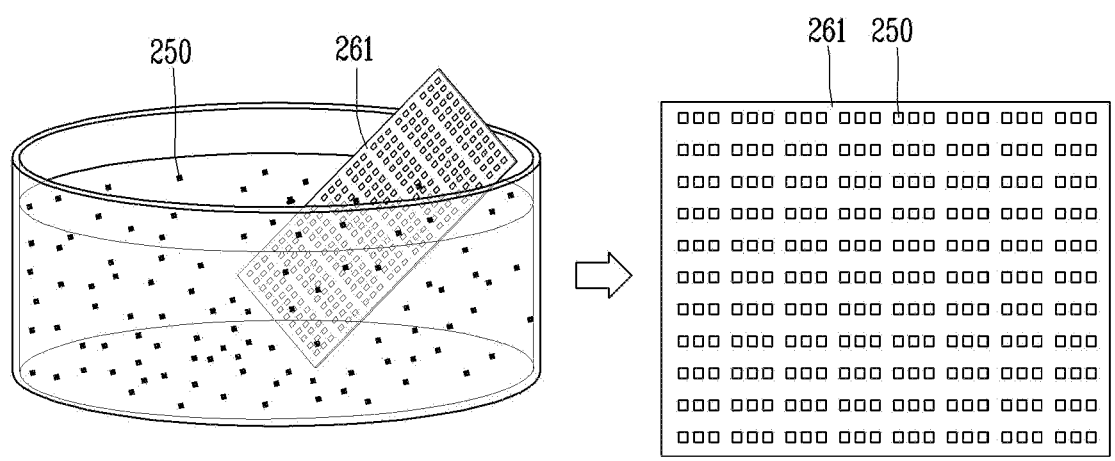

After that, the plurality of semiconductor light-emitting devices 150 are placed onto a substrate in a chamber filled with a fluid (FIG. 5E).

For example, the semiconductor light-emitting devices 150 and a substrate 161 are put into a chamber filled with a fluid, such that the semiconductor light-emitting devices 150 are self-assembled onto the substrate 161 using the flow, gravity, surface tension, and the like. Here, the substrate 161 may be an assembly substrate.

As another example, a wiring substrate, instead of the assembly substrate, may be put into the fluid chamber to allow the semiconductor light-emitting devices 150 to be directly seated on the wiring substrate. In this case, the substrate may be a wiring substrate. However, for the sake of convenience of explanation, the present disclosure exemplarily illustrates the case in which the substrate 161 is an assembly substrate on which the semiconductor light-emitting devices 150 are seated.

In order to allow the semiconductor light-emitting devices 150 to be easily placed onto the substrate 161, the substrate 161 may be provided with cells (not shown) into which the semiconductor light-emitting devices 150 are fitted. In detail, the cells into which the semiconductor light-emitting devices 150 are placed are formed at the substrate 161 in positions where the semiconductor light-emitting devices 150 are aligned with wiring electrodes. The semiconductor light-emitting devices 150 are assembled to the cells while moving in the fluid.

After the plurality of semiconductor light-emitting devices 150 are arrayed on the assembly substrate 161, the semiconductor light-emitting devices 150 of the assembly substrate 161 are transferred onto a wiring substrate, enabling large-area transfer. Therefore, the assembly substrate 161 may be referred to as a temporary substrate.

Meanwhile, the self-assembly described above requires increased transfer efficiency and transfer yield to be applied to the manufacture of a large screen display. The present disclosure provides a self-assembly apparatus (or device) and method that can minimize the influence of gravity or frictional force and prevent non-specific binding to increase the transfer yield.

To this end, in the display device according to the present disclosure, semiconductor light-emitting devices including magnetic materials are used to cause the semiconductor light-emitting devices to move by a magnetic force, and an electric field is used to allow the semiconductor light-emitting devices to be placed at predetermined positions while moving. Hereinafter, such a transfer method and apparatus will be described in more detail with the accompanying drawings.

Figure 6:
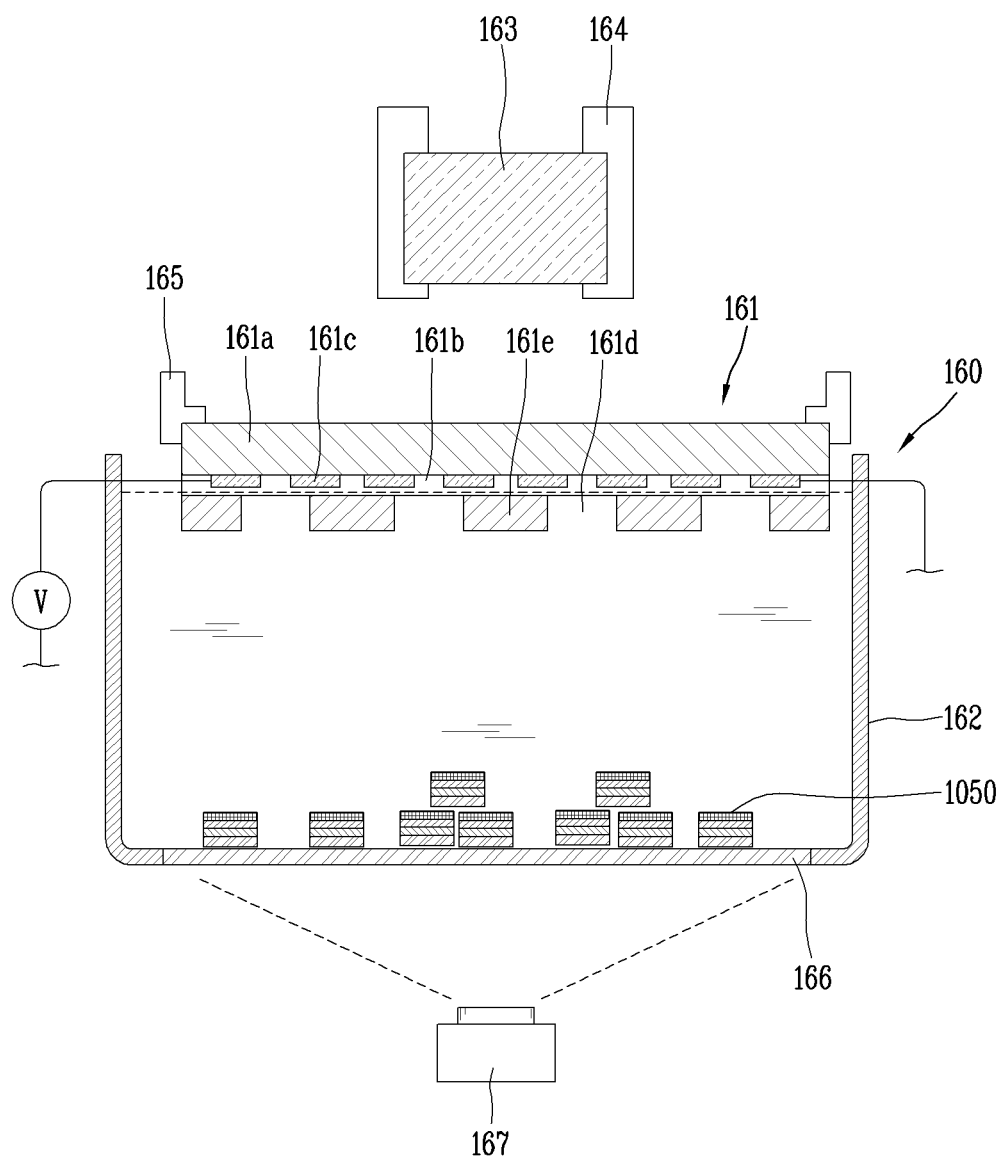
FIG. 6 illustrates a self-assembly apparatus for semiconductor light-emitting devices according to one implementation of the present disclosure.
Figure 7:
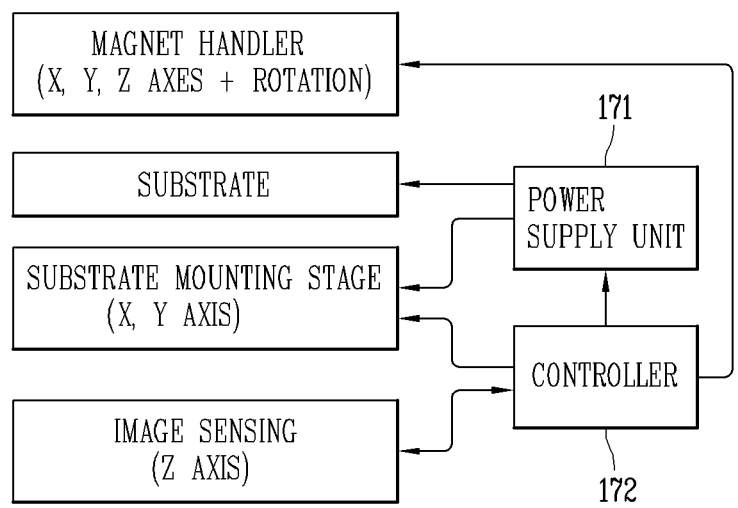
FIG. 7 is a block diagram of the self-assembly apparatus of FIG. 6.
Figure 8A:
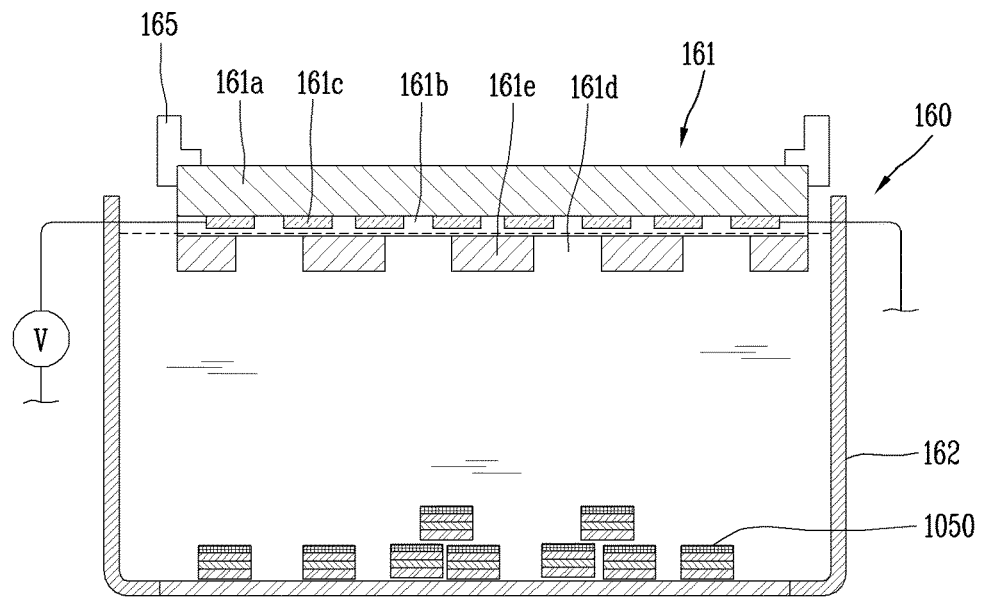
FIGS. 8A to 8E are conceptual views illustrating a self-assembly process of semiconductor light-emitting devices using the self-assembly apparatus of FIG. 6.
Figure 8B:
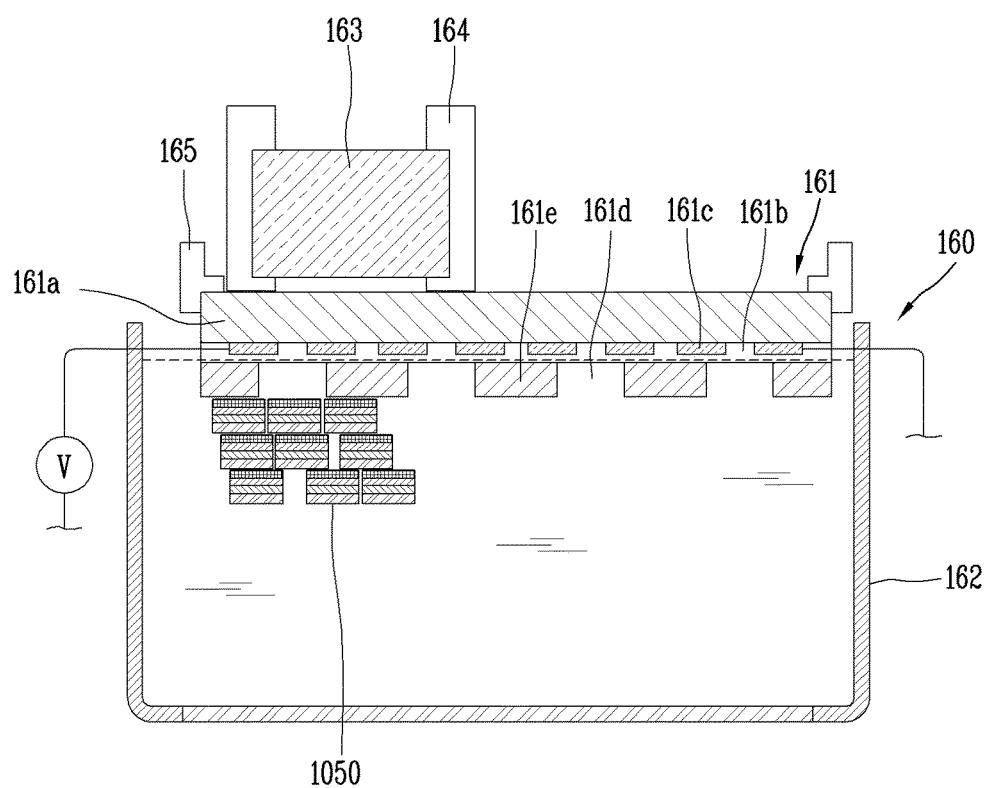
Figure 8C:
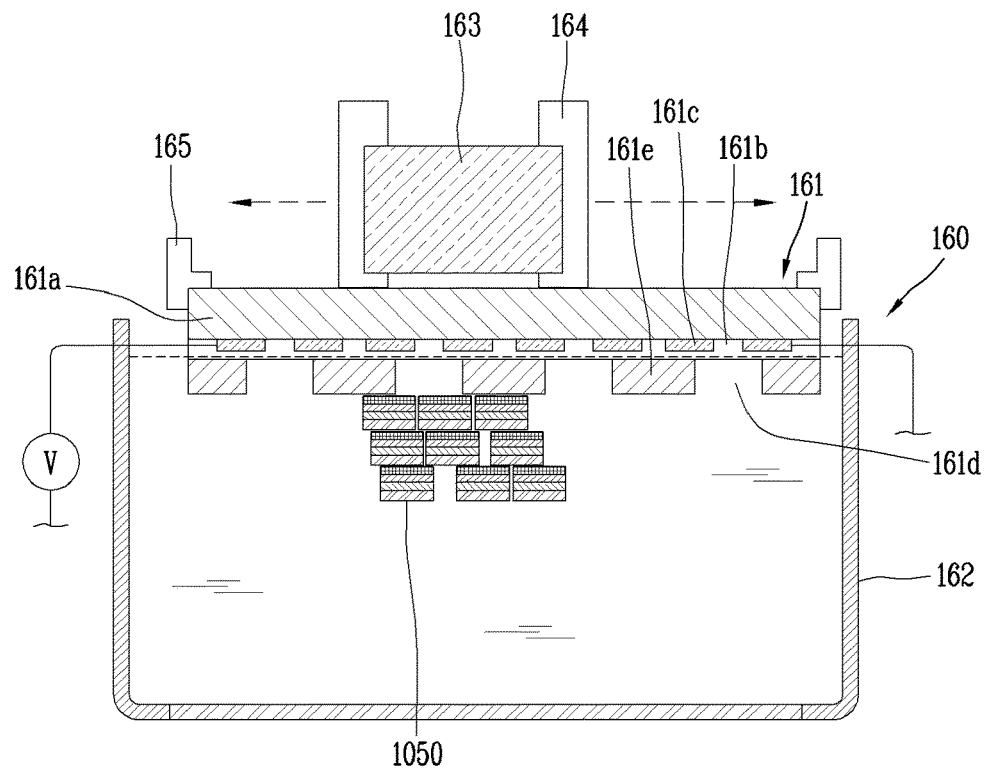
Figure 8D:
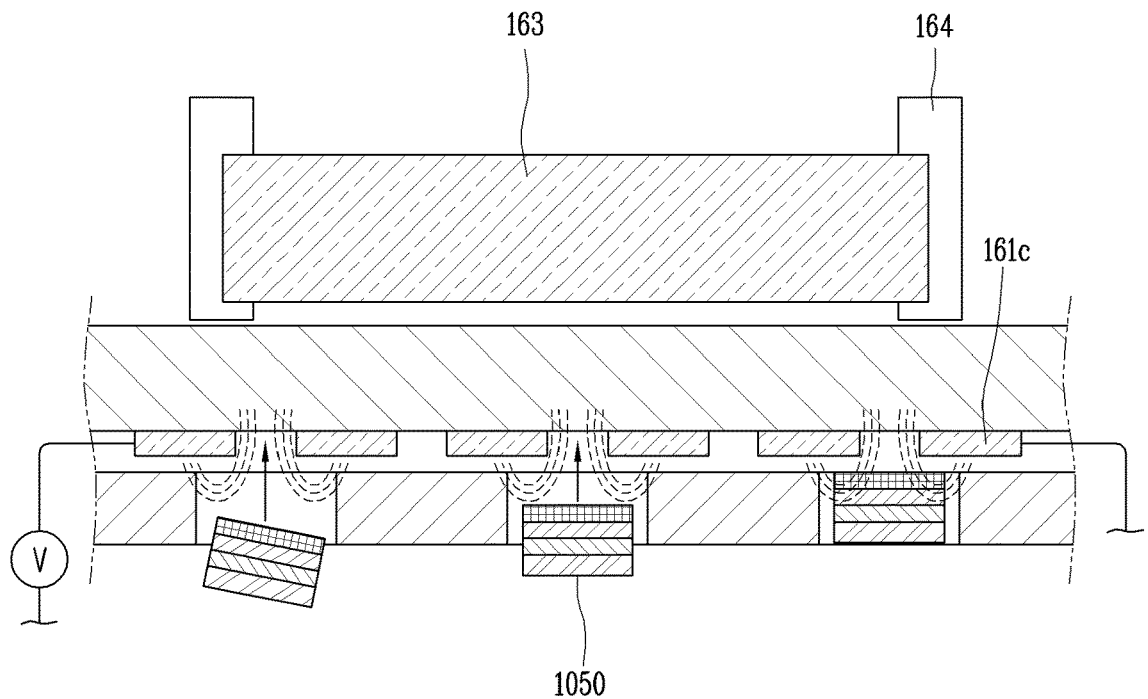
Figure 8E:
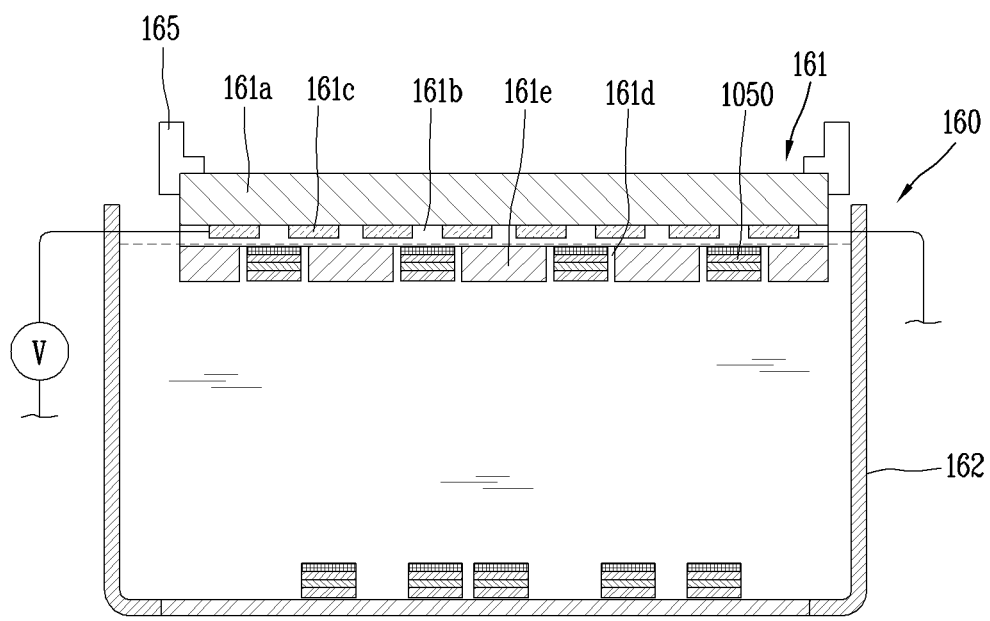
Figure 9:
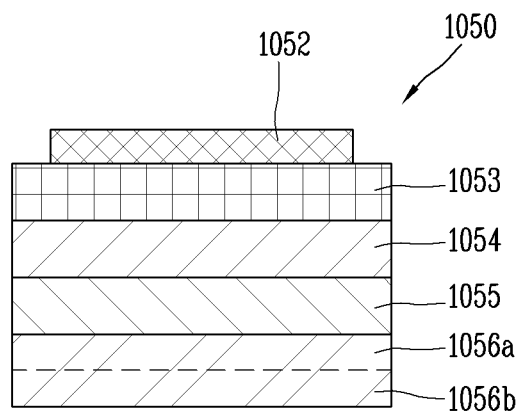
FIG. 9 is a conceptual view illustrating the semiconductor light-emitting devices of FIGS. 8A to 8E.

FIG. 6 illustrates a self-assembly apparatus for semiconductor light-emitting devices according to one implementation of the present disclosure, FIG. 7 is a block diagram of the self-assembly apparatus of FIG. 6, FIGS. 8A to 8E are conceptual views illustrating a self-assembly process of semiconductor light-emitting devices using the self-assembly apparatus of FIG. 6, and FIG. 9 is a conceptual view illustrating the semiconductor light-emitting devices of FIGS. 8A to 8E.

As illustrated in FIGS. 6 and 7, a self-assembly apparatus 160 of the present disclosure may include a fluid chamber 162, a magnet 163, and a position controller (or control unit) 164

The fluid chamber 162 has a space for accommodating a plurality of semiconductor light-emitting devices 1050. The space may be filled with a fluid. The fluid, which is an assembly solution, may include water and the like. Accordingly, the fluid chamber 162 may be a water tank (or tub) and be configured as an open type. However, the present disclosure is not limited thereto, and the fluid chamber 162 may alternatively be a closed type in which the space is implemented as a closed space.

The substrate 161 may be disposed at the fluid chamber 162 in a manner that an assembly surface thereof to which the semiconductor light-emitting devices 1050 are assembled faces downward. For example, the substrate 161 may be transferred to an assembly position by a transfer unit, and the transfer unit may include a stage 165 to which the substrate is mounted. A position of the stage 165 may be adjusted by a control unit, allowing the substrate 161 to be transferred to the assembly position.

In the assembly position, the assembly surface of the substrate 161 faces the bottom of the fluid chamber 162. As illustrated, the assembly surface of the substrate 161 is disposed to be immersed in the fluid of the fluid chamber 162. Accordingly, the semiconductor light-emitting devices 1050 move to the assembly surface in the fluid.

The substrate 161, which is an assembly substrate capable of producing an electric field, may include a base part 161a, a dielectric layer 161b, and a plurality of electrodes 161c.

The base part 161a may be made of an insulating material, and the plurality of electrodes 161c may be thin or thick film bi-planar electrodes patterned on one surface of the base part 161a. The electrode 161c may be formed of, for example, a stack of Ti/Cu/Ti, Ag paste, or indium tin oxide (ITO).

The dielectric layer 161b may be made of an inorganic material such as $SiO_2$, $SiN_x$, SiON, $Al_2O_3$, $TiO_2$, $HfO_2$, and the like. Alternatively, the dielectric layer 161b may be formed of a single or multi-layered organic insulator. The dielectric layer 161b may have a thickness in the range of several tens of nm to several μm.

Further, the substrate 161 according to the present disclosure includes a plurality of cells 161d partitioned by partition walls 161e. The cells 161d may be sequentially arranged in one direction and be made of a polymer material. The partition walls 161e defining the cells 161d may be shared with neighboring or adjacent cells 161d. The partition walls 161e may protrude from the base part 161a, and the cells 161d may be sequentially disposed along one direction by the partition walls 161e. More specifically, the cells 161d may be sequentially arranged in column and row directions and have a matrix structure.

As illustrated, the cells 161d may each include a groove for accommodating the semiconductor light-emitting device 150, and the grooves may be spaces defined by the partition walls 161e. A shape of the groove may be the same as or similar to a shape of the semiconductor light-emitting device. For example, when the semiconductor light-emitting device has a rectangular shape, the groove may also have a rectangular shape. Alternatively, although not shown, when the semiconductor light-emitting device has a circular shape, the groove formed in each of the cells may also have a circular shape. Further, each of the cells is configured to accommodate a single semiconductor light-emitting device. That is, one semiconductor light-emitting device is accommodated in one cell.

Meanwhile, the plurality of electrodes 161c may include a plurality of electrode lines disposed at the bottom of the cells 161d, respectively, and the plurality of electrode lines may extend to adjacent cells.

The plurality of electrodes 161c are disposed below the cells 161d, and different polarities are applied thereto to produce an electric field in the cells 161d. In order to produce the electric field, the dielectric layer 161b may cover the plurality of electrodes 161c to define the bottom of the cells 161d. In this structure, when different polarities are applied to a pair of electrodes 161c below the cells 161d, an electric field is produced, which allows the semiconductor light-emitting devices to be inserted into the cells 161d, respectively.

In the assembly position, the electrodes of the substrate 161 are electrically connected to a power supply unit 171. The power supply unit 171 applies power to the plurality of electrodes to generate the electric field.

As illustrated, the self-assembly apparatus 160 may include the magnet 163 for applying a magnetic force to the semiconductor light-emitting devices 1050. The magnet 163 is spaced apart from the fluid chamber 162 and configured to apply a magnetic force to the semiconductor light-emitting devices 150. The magnet 163 may be disposed to face a surface opposite to the assembly surface of the substrate 161, and a position of the magnet may be controlled by the position controller 164 that is connected to the magnet 163.

The semiconductor light-emitting device 1050 may include a magnetic material or substance to move in the fluid by the magnetic field of the magnet 163.

Referring to FIG. 9, the semiconductor light-emitting device 1050 including a magnetic material has a first conductive electrode 1052, a second conductive electrode 1056, a first conductive semiconductor layer 1053 on which the first conductive electrode 1052 is disposed, a second conductive semiconductor layer 1055 overlapping the first conductive semiconductor layer 1052 and beneath which the second conductive electrode 1056 is disposed, and an active layer 1054 disposed between the first and second conductive layers 1053 and 1055.

Here, the first conductive type may be a p-type and the second conductive type may be an n-type, and vice versa. As described above, a semiconductor light-emitting device without the active layer may also be available.

In the present disclosure, the first conductive electrode 1052 may be formed after the self-assembly of the semiconductor light-emitting devices on the wiring substrate. In addition, in the present disclosure, the second conductive electrode 1056 may include the magnetic material. The magnetic material may mean a magnetic metal. The magnetic material may be Ni, SmCo, or the like. Alternatively, the magnetic material may correspond to at least one of Gd-based, La-based, and Mn-based materials.

The magnetic material may be provided on the second conductive electrode 1056 in the form of particles. Alternatively, a conductive electrode including a magnetic material may be formed such that one layer of the conductive electrode may be made of a magnetic material. For example, as illustrated in FIG. 9, the second conductive electrode 1056 of the semiconductor light-emitting device 1050 may include a first layer 1056a and a second layer 1056b. Here, the first layer 1056a may include a magnetic material, and the second layer 1056b may include a non-magnetic metal material.

As illustrated, in this implementation, the first layer 1056a including the magnetic material may be disposed to be in contact with the second conductive semiconductor layer 1055. In this case, the first layer 1056*a* is disposed between the second layer 1056*b* and the second conductive semiconductor layer 1055. The second layer 1056*b* may be a contact metal connected to the second electrode of the wiring substrate. However, the present disclosure is not limited thereto, and the magnetic material may be disposed on one surface of the first conductive semiconductor layer.

Referring back to FIGS. 6 and 7, more specifically, the self-assembly apparatus may include a magnet handler that can automatically or manually moved in x, y, and z axes above the fluid chamber, or a motor capable of rotating the magnet 163. The magnet handler and the motor may constitute the position controller 164, allowing the magnet 163 to rotate in a horizontal direction, a clockwise direction, or a counterclockwise direction with respect to the substrate 161.

Meanwhile, a bottom plate 166 that is light transmissive or transparent may be defined in the fluid chamber 162, and the semiconductor light-emitting devices 1050 may be disposed between the bottom plate 166 and the substrate 161. An image sensor 167 may be disposed to face the bottom plate 166 to monitor the inside of the fluid chamber 162 through the bottom plate 166. The image sensor 167 may be controlled by the control unit 172 and include an inverted type lens and a CCD through which the assembly surface of the substrate 161 can be observed.

The self-assembly apparatus is configured to use a combination of a magnetic field and an electric field. The electric field allows the semiconductor light-emitting devices to be seated at predetermined positions of the substrate while moving according to a change in position of the magnet. Hereinafter, an assembly process using the self-assembly apparatus will be described in more detail.

First, a plurality of semiconductor light-emitting devices 1050 including magnetic materials are formed through the process described with reference to FIGS. 5A to 5C. Here, the magnetic material may be deposited on the semiconductor light-emitting device during the process of forming the second conductive electrode of FIG. 5C.

Then, a substrate 161 is transferred to an assembly position, and the semiconductor light-emitting devices 1050 are put into a fluid chamber 162 (FIG. 8A).

As described above, the assembly position of the substrate 161 may be a position disposed at the fluid chamber 162 in a manner that an assembly surface of the substrate 161 to which the semiconductor light-emitting devices 1050 are assembled faces downward.

In this case, some of the semiconductor light-emitting devices 1050 may sink to the bottom of the fluid chamber 162 and another some of the semiconductor light-emitting devices 1050 may float in the fluid. When a bottom plate 166 that is light transmissive is provided in the fluid chamber 162, some of the semiconductor light-emitting devices 1050 may sink to the bottom plate 166.

Next, a magnetic force is applied to the semiconductor light-emitting devices 1050 so that the semiconductor light-emitting devices 1050 vertically float in the fluid chamber 162 (FIG. 8B).

When a magnet 163 of the self-assembly apparatus moves from its original position to an opposite surface of the assembly surface of the substrate 161, the semiconductor light-emitting devices 1050 float toward the substrate 161 in the fluid. The original position may be a position deviated from the fluid chamber 162. As another example, the magnet 163 may be configured as an electromagnet. In this case, electricity is supplied to the electromagnet to generate an initial magnetic force.

Meanwhile, in this example, when a magnitude of the magnetic force is adjusted, a separation distance between the assembly surface of the substrate 161 and the semiconductor light-emitting devices 1050 may be controlled. For example, the separation distance is controlled by using the weight, buoyancy, and magnetic force of the semiconductor light-emitting devices 1050. The separation distance may be several millimeters to several tens of micrometers from the outermost surface of the substrate.

Next, a magnetic force is applied to the semiconductor light-emitting devices 1050 to cause the semiconductor light-emitting devices 1050 to move in one direction in the fluid chamber 162. For example, the magnet 163 is moved in a direction parallel to the substrate, a clockwise direction, or a counterclockwise direction (FIG. 8C). The semiconductor light-emitting devices 1050 move in a direction parallel to the substrate 161 by the magnetic force at a position spaced apart from the substrate 161.

Then, an electric field is applied to guide the semiconductor light-emitting devices 1050 to predetermined positions during the movement of the semiconductor light-emitting devices 1050, such that the semiconductor light-emitting devices 1050 are placed at the predetermined positions of the substrate 161 (FIG. 8C). For example, the semiconductor light-emitting devices 1050 moving in a direction horizontal to the substrate 161 are moved in a direction perpendicular (or vertical) to the substrate 161 by the electric field, allowing the semiconductor light-emitting devices 1050 to be seated at the predetermined positions.

More specifically, power is supplied to bi-planar electrodes of the substrate 161 to produce an electric field, so as to induce or enable the semiconductor light-emitting devices 1050 to be assembled only at the predetermined positions. That is, the selectively produced electric field allows the semiconductor light-emitting devices 1050 to be self-assembled at the assembly positions of the substrate 161. To this end, cells into which the semiconductor light-emitting devices 1050 are fitted may be provided at the substrate 161.

Then, unloading of the substrate 161 is performed, and the assembly process is completed. When the substrate 161 is an assembly substrate, a post-process for transferring arrayed semiconductor light-emitting devices to a wiring substrate to achieve a display device may be carried out, as described above.

Meanwhile, after guiding the semiconductor light-emitting devices 1050 to the predetermined positions, the magnet may be moved to a direction away from the substrate 161 such that the semiconductor light-emitting devices 1050 remaining in the fluid chamber 162 fall to the bottom of the fluid chamber 162 (FIG. 8D). As another example, in the case of the magnet 163 implemented as an electromagnet, the semiconductor light-emitting devices 1050 remaining in the fluid chamber 162 drop to the bottom of the fluid chamber 162 when power supply is stopped.

Then, the semiconductor light-emitting devices 1050 on the bottom of the fluid chamber 162 are collected to be reduced.

In the self-assembly apparatus and method described above, a magnetic field is applied to cause parts or components located distant to be placed near a predetermined assembly site to increase the assembly yield in fluidic assembly, and then an additional electric field is applied to the assembly site to allow the parts to be selectively assembled only onto the assembly site. Here, the assembly substrate is placed at an upper portion of the water tank and the assembly surface thereof is directed downward to minimize the influence of gravity due to weight of the parts and to prevent non-specific binding to thereby eliminate defects. That is, in order to increase the transfer yield, the assembly substrate is placed at the top to minimize the influence of gravity or frictional force, and to prevent non-specific binding.

With this configuration, in a display device in which individual pixels are implemented as semiconductor light-emitting devices, a large number of semiconductor light-emitting devices can be assembled at once.

As such, according to the present disclosure, a large number of semiconductor light-emitting devices can be pixelated on a small-sized wafer to be transferred onto a large-area substrate. Thus, a large-area display device can be manufactured at a low cost.

Meanwhile, the present disclosure provides a structure and method for an assembly substrate to increase the self-assembly process yield and the process yield after the self-assembly. The present disclosure is limited to when the substrate 161 is used as an assembly substrate. That is, the assembly substrate described later is not used as a wiring substrate of the display device. Therefore, the substrate 161 will be referred to as an assembly substrate 161 hereinafter.

The present disclosure can improve the process yield in two respects. First, according to the present disclosure, a strong electric field is not produced in an undesirable position, so as to prevent the semiconductor light-emitting devices from being placed at undesirable positions. Second, the present disclosure can prevent the semiconductor light-emitting devices from being remained or left in the assembly substrate when the semiconductor light-emitting devices seated on the assembly substrate are transferred onto another substrate.

The above-described problems cannot be individually achieved by different components. These two problems can be addressed by the organic combination of a component to be described hereinafter and the assembly substrate 161 described above.

Before describing the present disclosure in detail, a post-process for manufacturing a display device after the self-assembly will be described.

Figure 10A:
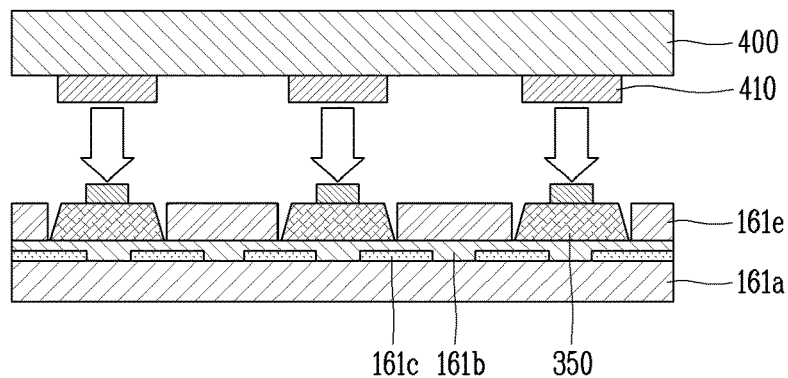
FIGS. 10A to 10C are conceptual views illustrating the transfer of semiconductor light-emitting devices after a self-assembly process according to the present disclosure.
Figure 10B:
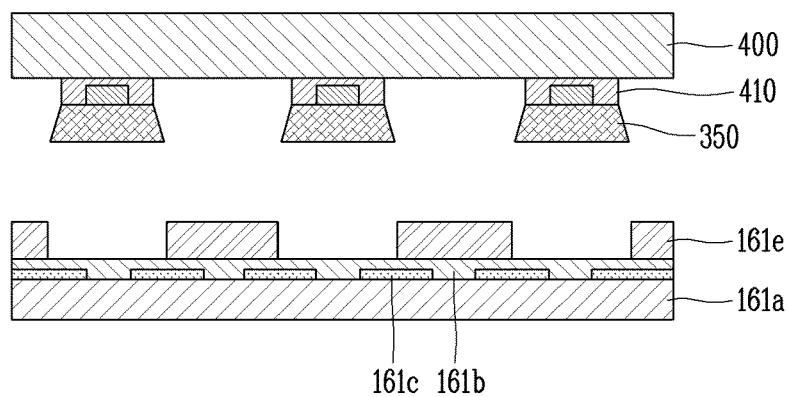
Figure 10C:
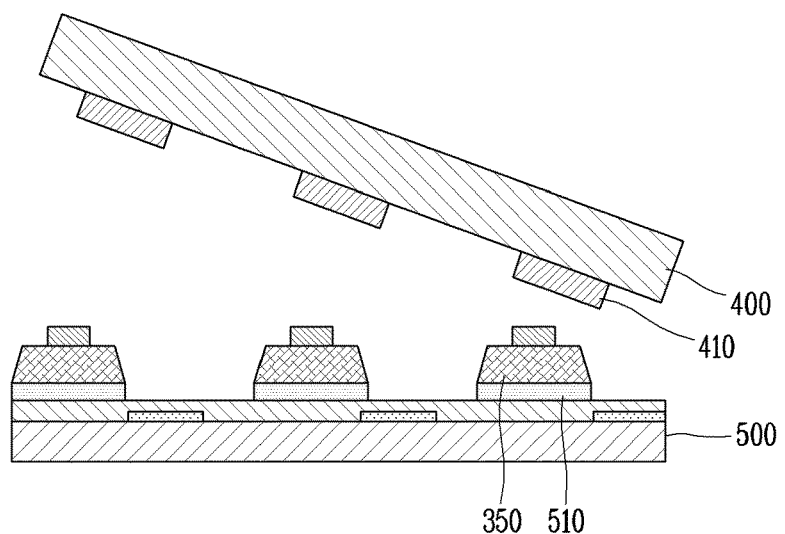

FIGS. 10A to 10C are conceptual views illustrating the transfer of semiconductor light-emitting devices after a self-assembly process according to the present disclosure.

When the self-assembly process described with reference to FIGS. 8A to 8E is completed, the semiconductor light-emitting devices are placed at predetermined positions of the assembly substrate 161. The semiconductor light-emitting devices seated on the assembly substrate 161 are transferred onto another substrate at least once. Herein, an example in which semiconductor light-emitting devices seated on the assembly substrate 161 are transferred twice. However, the present disclosure is not limited thereto, and the semiconductor light-emitting devices placed on the assembly substrate 161 may be transferred onto another substrate once or three times.

Meanwhile, immediately after completing the self-assembly process, the assembly surface of the assembly substrate 161 is facing downward (or the direction of gravity). For the process after the self-assembly process, the assembly substrate 161 may be turned over 180 degrees with the semiconductor light-emitting devices seated thereon. In this process, the semiconductor light-emitting devices may be separated from the assembly substrate 161, a voltage should be applied to the plurality of electrodes 161c (hereinafter, "assembly electrodes") while the assembly substrate 161 is being turned over. An electric field produced between the assembly electrodes prevents the semiconductor light-emitting devices from being separated from the assembly substrate 161 while the assembly substrate 161 is being turned over.

When the assembly substrate 161 is turned over 180 degrees after the self-assembly process, it will be like as shown in FIG. 10A. As illustrated in FIG. 10A, the assembly surface of the assembly substrate 161 faces upward (or a direction opposite to gravity). In this state, a transfer substrate 400 is aligned above the assembly substrate 161.

The transfer substrate 400 is a substrate used for transferring semiconductor light-emitting devices 350 seated on the assembly substrate 161 to a wiring substrate by making the semiconductor light-emitting devices 350 separated or detached from the assembly substrate 161. The transfer substrate 400 may be made of a polydimethylsiloxane (PDMS) material. Accordingly, the transfer substrate 400 may be referred to as a PDMS substrate.

The transfer substrate 400 is aligned with the assembly substrate 161 to be pressed onto the assembly substrate 161. Then, when the transfer substrate 400 is moved above the assembly substrate 161, the semiconductor light-emitting devices 350 disposed on the assembly substrate 161 are moved to the transfer substrate 400 by an adhesive force of the transfer substrate 400.

To this end, surface energy between the semiconductor light-emitting device 350 and the transfer substrate 400 should be higher than surface energy between the semiconductor light-emitting device 350 and the dielectric layer 161b. The greater the difference between the two surface energies, the higher the possibility of separation of the semiconductor light-emitting device 350 from the assembly substrate 161. Therefore, a greater difference between the two surface energies is more advantageous.

The transfer substrate 400 may include a plurality of protrusion portions 410 to allow pressure applied by the transfer substrate 400 to be concentrated on the semiconductor light-emitting devices 350 when the transfer substrate 400 is pressed onto the assembly substrate 161. The protrusion portions 410 may be formed at the same intervals as the semiconductor light-emitting devices 350 seated on the assembly substrate 161. When pressing the transfer substrate 400 onto the assembly substrate 161 after aligning the protrusion portions 410 with the semiconductor light-emitting devices 350 to overlap each other, pressure by the transfer substrate 400 may be concentrated only on the semiconductor light-emitting devices 350. Thus, the present disclosure increases the possibility of separation of the semiconductor light-emitting devices 350 from the assembly substrate 161.

Meanwhile, portions of the semiconductor light-emitting devices 350 may, preferably, be exposed to the outside of grooves in a state the semiconductor light-emitting devices 350 are placed on the assembly substrate 161. When the semiconductor light-emitting devices 350 are not exposed to the outside of the grooves, pressure by the transfer substrate 400 is not concentrated on the semiconductor light-emitting devices 350. This may result in reducing the possibility of separation of the semiconductor light-emitting devices 350 from the assembly substrate 161.

Finally, referring to FIG. 10C, the transfer substrate 400 is pressed onto a wiring substrate 500 to transfer the semiconductor light-emitting devices 350 onto the wiring substrate 500 from the transfer substrate 400. Here, protruding portions 510 may be formed on the wiring substrate 500. The transfer substrate 400 and the wiring substrate 500 are aligned such that the semiconductor light-emitting devices 350 disposed on the transfer substrate 400 and the protruding portions 510 overlap each other. Then, when the transfer substrate 400 and the wiring substrate 500 are pressed against each other, the possibility of separation of the semiconductor light-emitting devices 350 from the transfer substrate 400 can be increased due to the protruding portions 510.

In order for the semiconductor light-emitting devices 350 disposed on the transfer substrate 400 to be transferred onto the wiring substrate 500, surface energy between the semiconductor light-emitting devices 350 and the wiring substrate 500 should be higher than surface energy between the semiconductor light-emitting devices 350 and the transfer substrate 400. The greater the difference between the two surface energies, the higher the possibility of separation of the semiconductor light-emitting device 350 from the transfer substrate 400. Therefore, a greater difference between the two surface energies is more advantageous.

After transferring all the semiconductor light-emitting devices 350 disposed on the transfer substrate 400 to the wiring substrate 500, electrical connection between the semiconductor light-emitting devices 350 and wiring electrodes formed on the wiring substrate 500 may be carried out. A structure of the wiring electrodes and a method of the electrical connection may vary according to a type of the semiconductor light-emitting device 350.

Although not illustrated, an anisotropic conductive film may be disposed on the wiring substrate 500. In this case, an electrical connection can be provided between the semiconductor light-emitting devices 350 and the wiring electrodes formed on the wiring substrate 500 by only pressing the transfer substrate 400 and the wiring substrate 500 against each other.

When manufacturing a display device including semiconductor light-emitting devices that emit light of different colors, the method described with reference to FIGS. 10A to 10C may be implemented in various ways. Hereinafter, a method of manufacturing a display device including semiconductor light-emitting devices emitting red (R), green (G), and blue (B) light will be described.

Figure 11:
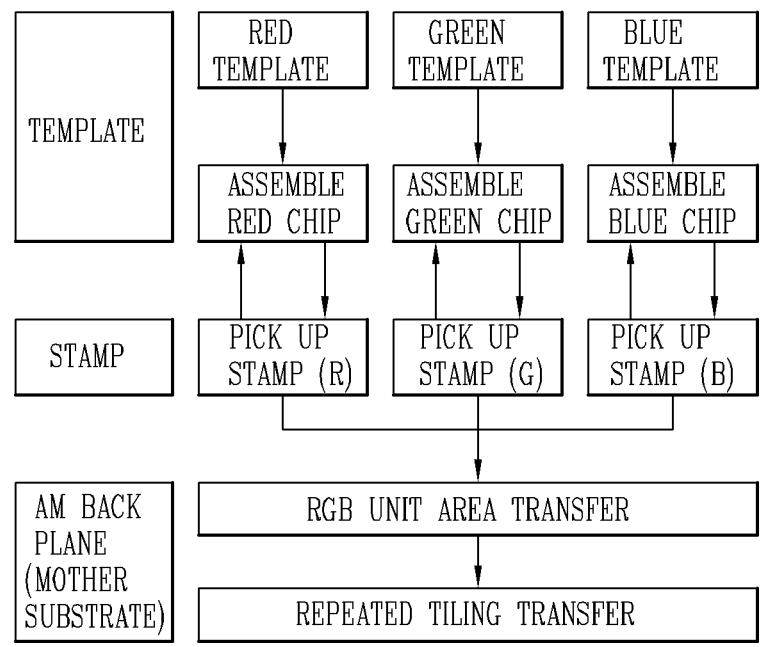
FIGS. 11 to 13 are flowcharts illustrating a method of manufacturing a display device including semiconductor light-emitting devices emitting red (R), green (G), and blue (B) light.
Figure 12:
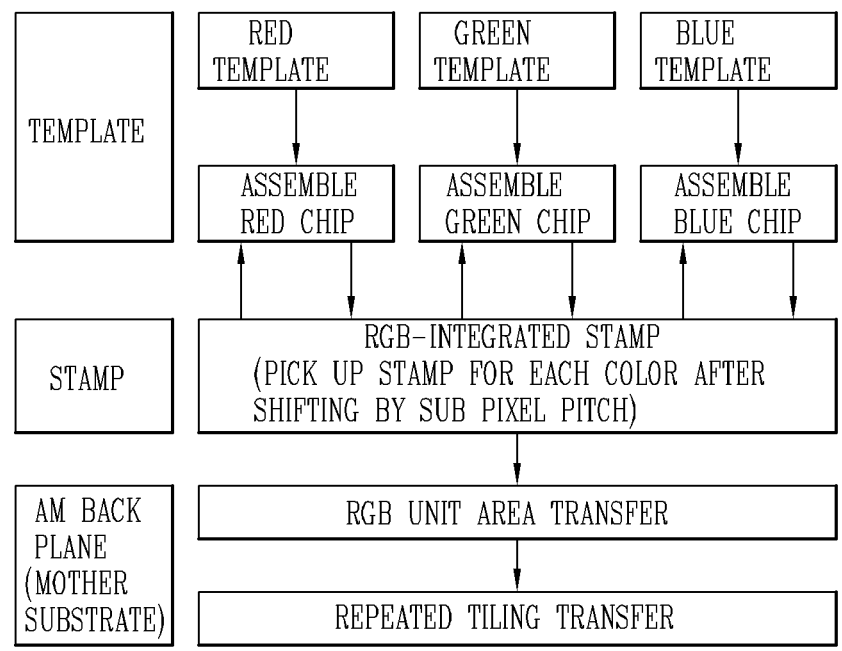
Figure 13:
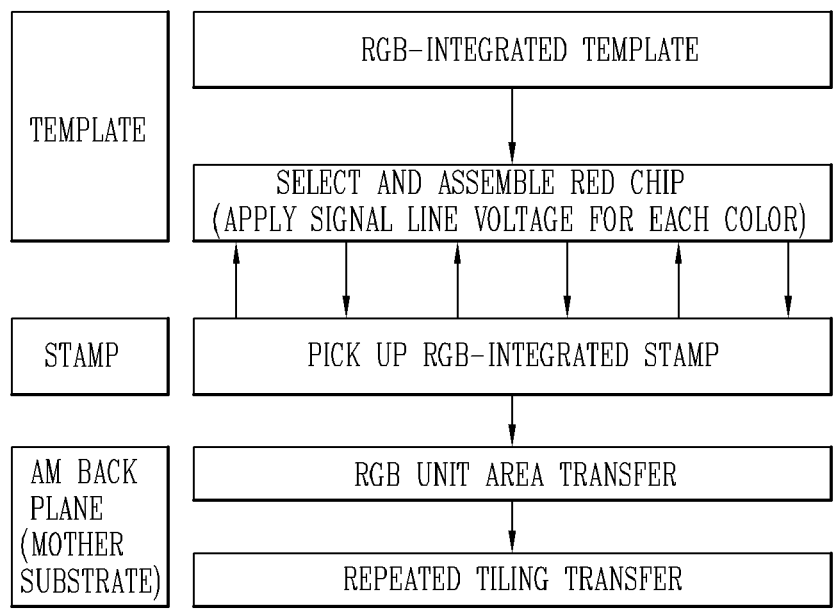

FIGS. 11 to 13 are flowcharts illustrating a method of manufacturing a display device including semiconductor light-emitting devices emitting red (R), green (G), and blue (B) light.

Semiconductor light-emitting devices emitting light of different colors may be individually assembled on different assembly substrates (templates). In detail, the assembly substrate 161 includes a first assembly substrate on which semiconductor light-emitting devices emitting a first color are placed, a second assembly substrate on which semiconductor light-emitting devices emitting a second color different from the first color are placed, and a third assembly substrate on which semiconductor light-emitting devices emitting a third color different from the first and second colors are placed. Different types of semiconductor light-emitting devices are assembled on the respective assembly substrates according to the method described with reference to FIGS. 8A to 8E. For example, the semiconductor light-emitting devices emitting red (R), green (G), and blue (B) light may be assembled on the first to third assembly substrates, respectively.

Referring to FIG. 11, red chips, green chips, and blue chips may be assembled on first to third assembly substrates, namely, a red template, a green template, and a blue template, respectively. In this state, the red chips, the green chips, and the blue chips may be transferred to a wiring substrate by different transfer substrates.

In detail, transferring the semiconductor light-emitting devices seated on the respective assembly substrates to the wiring substrate may include the steps of pressing a first transfer substrate (stamp (R)) onto the first assembly substrate (red template) to transfer semiconductor light-emitting devices emitting the first color (red chips) to the first transfer substrate (stamp (R)) from the first assembly substrate (red template), pressing a second transfer substrate (stamp (G)) onto the second assembly substrate (green template) to transfer semiconductor light-emitting devices emitting the second color (green chips) to the second transfer substrate (stamp (G)) from the second assembly substrate (green template), and pressing a third transfer substrate (stamp (B)) onto the third assembly substrate (blue template) to transfer semiconductor light-emitting devices emitting the third color (blue chips) to the third transfer substrate (stamp (B)) from the third assembly substrate (blue template).

Then, the first to third transfer substrates are pressed onto the wiring substrate, so that the semiconductor light-emitting devices emitting the first to third colors are transferred to the wiring substrate from the respective first to third transfer substrates.

According to the manufacturing method of FIG. 11, three types of assembly substrates and three types of transfer substrates are required to manufacture a display device including red, green, and blue chips.

Unlike this method, referring to FIG. 12, red chips, green chips, and blue chips may be assembled on first to third assembly substrates, namely, a red template, a green template, and a blue template, respectively. In this state, the red chips, the green chips, and the blue chips may be transferred to a wiring substrate by the same transfer substrate.

In detail, transferring the semiconductor light-emitting devices seated on the assembly substrates to the wiring substrate may include the steps of pressing a transfer substrate (RGB integrated stamp) onto the first assembly substrate (red template) to transfer semiconductor light-emitting devices emitting the first color (red chips) to the transfer substrate (RGB integrated stamp) from the first assembly substrate (red template), pressing the transfer substrate (RGB integrated stamp) onto the second assembly substrate (green template) to transfer semiconductor light-emitting devices emitting the second color (green chips) to the transfer substrate (RGB integrated stamp) from the second assembly substrate (green template), and pressing the transfer substrate (RGB integrated stamp) onto the third assembly substrate (blue template) to transfer semiconductor light-emitting devices emitting the third color (blue chips) to the transfer substrate (RGB integrated stamp) from the third assembly substrate (blue template).

Here, alignment positions between the first to third assembly substrates and the transfer substrate may vary. For example, when the assembly substrates and the transfer substrate are aligned with each other, a relative position of the transfer substrate with respect to the first assembly substrate and a relative position of the transfer substrate with respect to the second assembly substrate may be different from each other. The transfer substrate may shift the alignment position by a sub pixel pitch whenever a type of the assembly substrate is changed. In this way, when the transfer substrate is pressed onto the first to third assembly substrates sequentially, all three types of chips may be transferred to the transfer substrate.

Then, as described in FIG. 11, the transfer substrate is pressed onto the wiring substrate such that the semiconductor light-emitting devices emitting the first to third colors are transferred to the wiring substrate from the transfer substrate.

According to the manufacturing method of FIG. 12, three types of assembly substrates and one type of a transfer substrate are required to manufacture a display device including red, green, and blue chips.

Unlike the examples described in FIGS. 11 and 12, according to FIG. 13, all of red chips, green chips, and blue chips may be assembled on one assembly substrate (RGB integrated template). In this state, the red chips, the green chips, and the blue chips may be transferred to a wiring substrate by the same transfer substrate (RGB integrated stamp).

According to the manufacturing method of FIG. 13, one type of an assembly substrate and one type of a transfer substrate are required to manufacture a display device including red, green, and blue chips.

As such, when manufacturing a display device including semiconductor light-emitting devices emitting light of different colors, its manufacturing method may be implemented in various ways.

The present disclosure relates to an assembly substrate having a structure that can improve a transfer rate of semiconductor light-emitting devices to a transfer substrate by controlling or adjusting a contact force between a surface of an assembly substrate and the semiconductor light-emitting devices in the transfer process illustrated in FIGS. 10A to 10C. Hereinafter, various implementations of the present disclosure will be described with reference to the accompanying drawings.

First, a structure of the related art assembly substrate used in a method of manufacturing a display device and the form (shape) of an electric field produced in the assembly substrate during self-assembly will be briefly described with reference to FIGS. 14 and 15.

Figure 14:
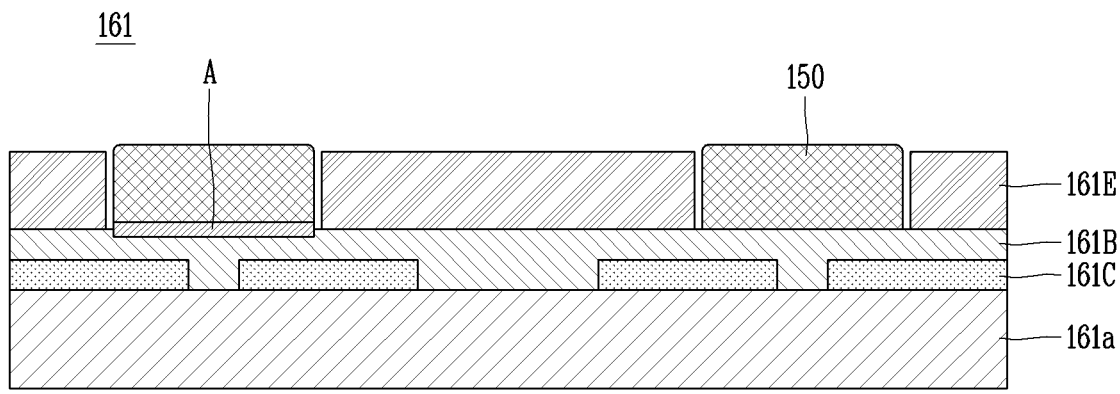
FIG. 14 is a cross-sectional view illustrating a structure of an assembly substrate used for manufacturing a display device.
Figure 15:
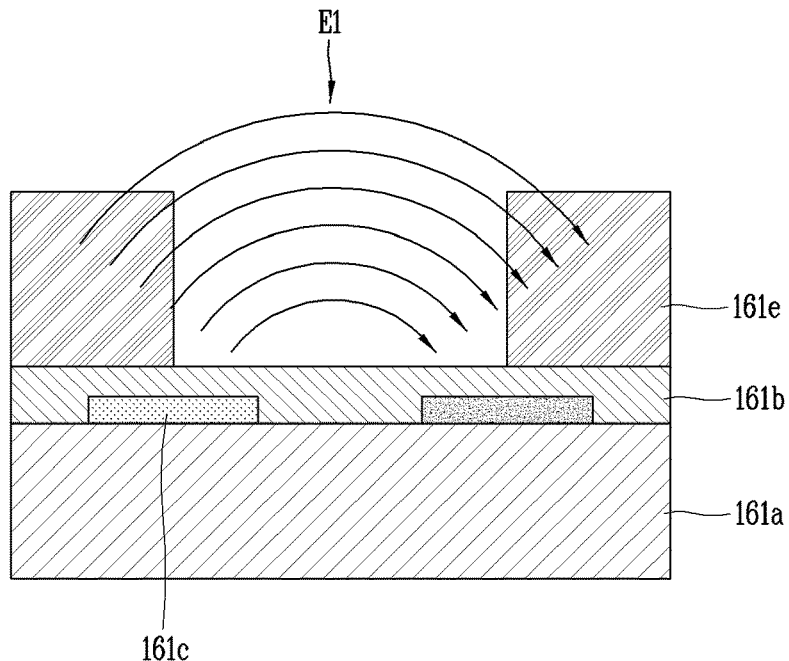
FIG. 15 is a conceptual view illustrating an electric field produced between assembly electrodes.

FIG. 14 is a cross-sectional view illustrating a structure of an assembly substrate used for manufacturing a display device, and FIG. 15 is a conceptual view illustrating an electric field produced between assembly electrodes.

An assembly substrate 161 may be a substrate used for a method of manufacturing a display device, and more particularly, a substrate used for a method of manufacturing a display device using self-assembly. Here, the self-assembly may be a display manufacturing method in which semiconductor light-emitting devices are placed at predetermined positions of the assembly substrate 161 using an electric field and a magnetic field.

The conventional assembly substrate 161 may include a base part 161a, a dielectric layer 161b, a plurality of assembly electrodes 161c, cells 161d into which semiconductor light-emitting devices 150 are placed, respectively, and partition walls 161e.

The plurality of assembly electrodes 161c may extend in one direction and be disposed in parallel on the base part 161a, and the dielectric layer 161b may be stacked or disposed on the base part 161a to cover the plurality of assembly electrodes 161c.

The partition walls 161e may be disposed on the dielectric layer 161b. More specifically, the partition walls 161e may be disposed to define the cells 161d at predetermined intervals along the extension direction of the assembly electrodes 161c so as to overlap portions of the assembly electrodes. The semiconductor light-emitting devices 150 may be placed into the cells 161d, respectively.

When a voltage is applied to the assembly electrodes 161c from the outside, as shown in FIG. 15, an electric field E1 may be formed in the cell 161d. The semiconductor light-emitting device 150 may be placed into the cell 161d by the electric field E1 and separated from the cell 161d when the electric field E1 is extinguished. The electric field E1 becomes stronger as it gets closer to the assembly electrode 161c and becomes weaker as it gets further away from the assembly electrode 161c.

When the self-assembly is completed, a transfer process for transferring the semiconductor light-emitting devices 150 seated on the assembly substrate 161 to a transfer substrate 400 is carried out. The transfer substrate 400 may be pressed onto the assembly substrate 161 for the transfer of the semiconductor light-emitting devices 150.

Since the assembly substrate 161 is repeatedly used in the fluid, impurities are accumulated in the cell 161d, which causes a contamination layer A on the inner surfaces of the cell 161d. Then, the semiconductor light-emitting device 150 seated into the cell 161d remains adhered to the assembly substrate 200 even after the electric field E1 is extinguished due to the contaminant layer A, resulted in a decrease in the transfer rate of the semiconductor light-emitting devices 150 to the transfer substrate 400.

In order to prevent this, an assembly substrate according to an implementation of the present discloses provides a structure that can improve the transfer rate of semiconductor light-emitting devices to a transfer substrate by reducing a contact force between the assembly substrate and the semiconductor light-emitting devices.

Hereinafter, various implementations of a structure of an assembly substrate according to the present disclosure will be described in detail with reference to FIGS. 16 to 18.

Figure 16:
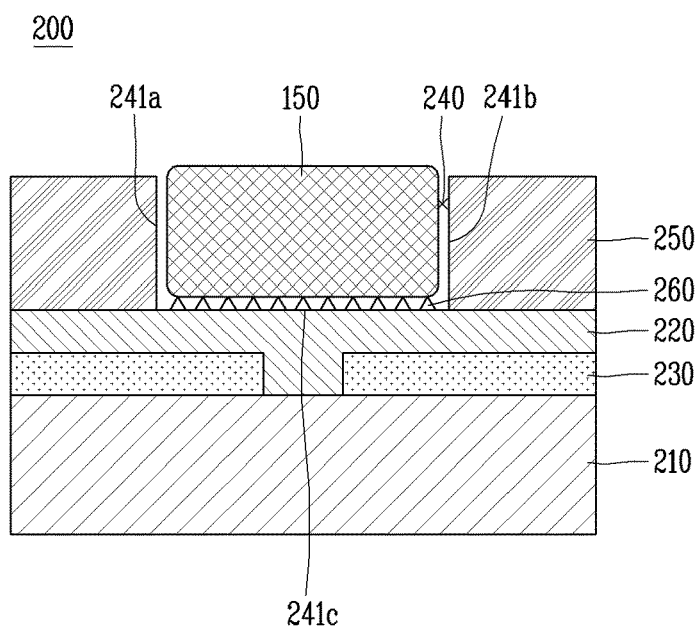
FIG. 16 is a cross-sectional view illustrating a state in which a semiconductor light-emitting device is placed onto an assembly substrate according to an implementation of the present disclosure.
Figure 17:
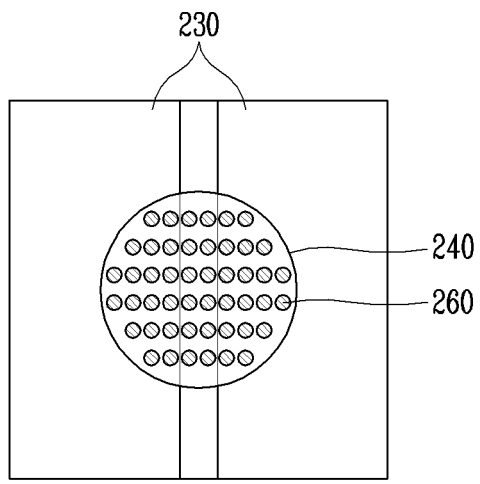
FIG. 17 illustrates various examples of a protrusion part.
Figure 17:
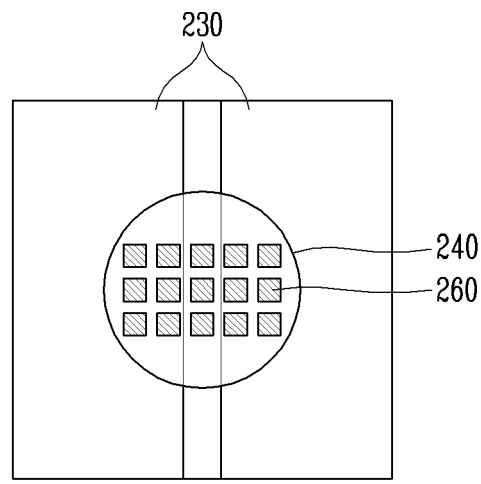
Figure 17:
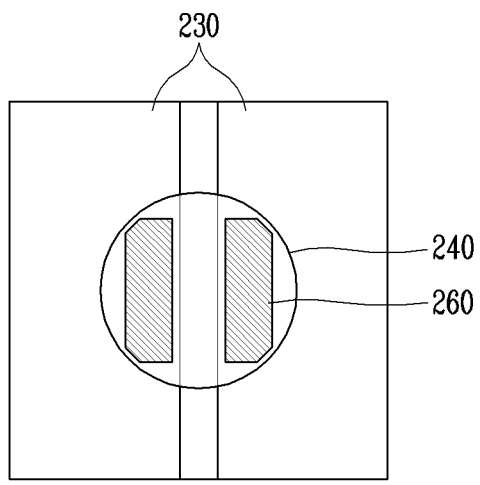
Figure 17:
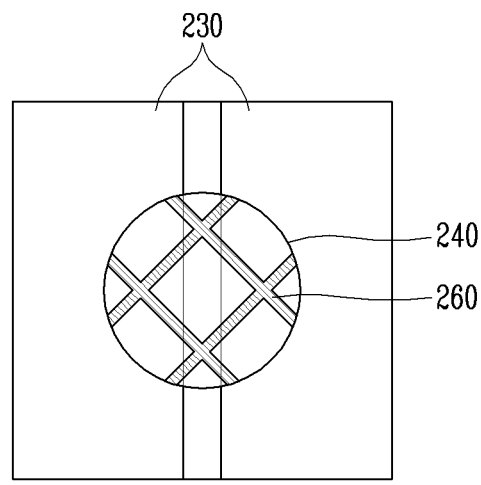
Figure 18:
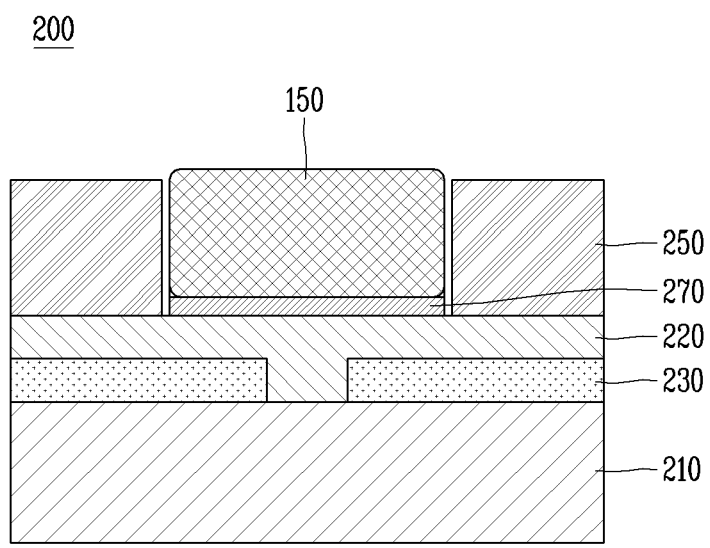
FIG. 18 is a cross-sectional view illustrating a state in which a semiconductor light-emitting device is placed onto an assembly substrate according to another implementation of the present disclosure.

FIG. 16 is a cross-sectional view illustrating a state in which a semiconductor light-emitting device is placed onto an assembly substrate according to an implementation of the present disclosure, FIG. 17 illustrates various examples of a protrusion part, and FIG. 18 is a cross-sectional view illustrating a state in which a semiconductor light-emitting device is placed onto an assembly substrate according to another implementation of the present disclosure.

Like the conventional assembly substrate 161, an assembly substrate 200 according to an implementation of the present disclosure may include a base part 210, a dielectric layer 220, a plurality of assembly electrodes 230, cells 240 into which semiconductor light-emitting devices 150 are placed, respectively, and partition walls 250. In addition, a protrusion part 260 may protrude inward (to an inside of the cell) from at least one of inner surfaces 241 of each of the cells 240.

The plurality of assembly electrodes 230 may extend in one direction and be disposed in parallel on the base part 210, and the dielectric layer 220 may be disposed on the base part 210 to cover the plurality of assembly electrodes 230.

The partition walls 250 may be disposed on the dielectric layer 220. In detail, the partition walls 250 may be disposed to define the cells 240 at predetermined intervals along the extension direction of the assembly electrodes 230 so as to overlap portions of the assembly electrodes 230. The semiconductor light-emitting devices 150 may be placed into the cells 161d, respectively.

Voltages of different polarities may be applied to adjacent assembly electrodes 230 among the plurality of assembly electrodes 230, and the cell 240 may overlap both the adjacent assembly electrodes 230 to thereby form an electric field E1 in the cell 240.

In order to reduce a contact force between the semiconductor light-emitting device 150 and the assembly substrate 200, the assembly substrate 200 according to the implementation of the present disclosure may include the protrusion part 260 protruding to the inside of the cell from at least one of the inner surfaces 241 of the cell 240 into which the semiconductor light-emitting device 150 is seated. The protrusion part 260 allows a contact area between the assembly substrate 200 and the semiconductor light-emitting device 150 to be decreased, thereby reducing a contact force.

A space in the cell 240 may be a space defined by the dielectric layer 220 and the partition walls 250, and correspond to an upper surface (a bottom surface of the cell 240) 241c of the dielectric layer 220 and side surfaces 241a and 241b of the partition walls 250. The semiconductor light-emitting device 150 may be seated into the cell 240 by the electric field E1 while being in contact with at least one of the inner surfaces 241 of the cell 240. Due to this contact, a contact force may be formed between the semiconductor light-emitting device 150 and the assembly substrate 200.

The protrusion part 260 may be formed on at least one of the inner surfaces 241a, 241b, and 241c of the cell 240 in contact with the semiconductor light-emitting device 150 placed into the cell 240, allowing a contract force between the assembly substrate 200 and the semiconductor light-emitting device 150 to be adjusted.

In detail, the cell 240 may be larger in size than the semiconductor light-emitting device 150 to allow the semiconductor light-emitting device 150 to be easily seated. Accordingly, the semiconductor light-emitting device 150 placed into the cell 240 may or may not be in contact with one of the side surfaces 241a and 241b of the cell 240 while being in contact with the bottom surface 241c of the cell in a selective manner. In addition, the side surfaces 241a and 241b may be different regions of one continuous surface according to a shape of the cell 240. In this case, the semiconductor light-emitting device 150 may or may not be in contact with one of the regions (241a, 241b) of the one surface the cell 240.

Considering the state of the semiconductor light-emitting device 150 being placed into the cell 240, as illustrated in FIG. 16, the protrusion part 260 may always form a contact area with at least the semiconductor light-emitting device 150 and be formed on the upper surface 241c of the dielectric layer 220 with a large contract area. In terms of the process, the upper surface 241c of the dielectric layer 220 is suitable for forming the protrusion part 260.

In some implementations, the protrusion part 260 may include a plurality of protrusions, and the semiconductor light-emitting device 150 placed into the cell 240 may be brought into contact with at least some of the plurality of protrusions. That is, when the protrusion part 260 is formed on at least one of the inner surfaces 241 of the cell 240, a contact force between the assembly substrate 200 and the semiconductor light-emitting device 150 may be generated by the protrusion part 260 in contact with the semiconductor light-emitting device 150.

The protrusion part 260 may be formed in various shapes as illustrated in FIG. 17. The protrusion part 260 may be configured as one protrusion, or a plurality of dot and/or linear protrusions having various shapes as shown in FIG. 17. In addition, the protrusion part 260 may have a double structure (double-structured protrusion) in which protrusions having different shapes, pitches, sizes, and the like are formed. For example, dot protrusions may be formed between linear protrusions, or protrusions having different shapes and sizes may be formed between protrusions with a specific pattern.

Meanwhile, the protrusion part 260 may be made of a material the same as a material defining the inner surfaces 241a, 241b, and 241c of the cell 240 on which the protrusion part 260 is formed. For example, the protrusion part 260 formed on the bottom surface 241c of the cell 240 may be made of the same material as the dielectric layer 220, and the protrusion part 260 formed on the side surfaces 241a and 241b of the cell 240 may be made of the same material as the partition walls 250. In this case, the protrusion part 260 may be formed such that a $SiO_2$ layer is deposited on the dielectric layer 220 or the partition walls 250, a photolithography process is performed to form a desired pattern, and the patterned $SiO_2$ layer is removed by dry or wet etching. The protrusion part 260 may also be formed by other methods.

Alternatively, the protrusion part 260 may be made of a material different from the material defining the inner surfaces 241a, 241b, and 241c of the cell 240 on which the protrusion part 260 is formed, and, preferably, made of a material having a smaller (or lower) contact force than the material defining the inner surfaces 241a, 241b, and 241c with respect to the semiconductor light-emitting device 150. In this case, the protrusion part 260 may be formed by sputtering photolithography, or the like. A method of forming the protrusion part 260 is not limited to a specific method.

According to another implementation of the present disclosure, a functional layer 270 may be formed on at least one of the inner surfaces 241 of cell 240 to reduce a contact force between the semiconductor light-emitting device 150 and the assembly substrate 200 as illustrated in FIG. 18. The functional layer 270 may be made of a material having a contact force smaller than the material defining the inner surfaces 241 of the cell 240 with respect to the semiconductor light-emitting device 150. The functional layer 270 may control or adjust energy acting on a contact surface between the assembly substrate 200 and the semiconductor light-emitting device 150.

As described above, considering the state of the semiconductor light-emitting device 150 seated into the cell 240, as illustrated in FIG. 18, the functional layer 270 may always form a contact surface at least with the semiconductor light-emitting device 150 placed into the cell 240, and be formed on the upper surface 241c of the dielectric layer 220 with a large contact area. In terms of the process, the upper surface 241c of the dielectric layer 220 is suitable for forming the functional layer 270.

The functional layer 270 may be formed entirely or partially on at least one of the inner surfaces 241a, 241b, and 241c of the cell 240.

In addition, the functional layer 270 may be a separate layer distinct from the inner surfaces 241 of the cell 240 formed by sputtering, coating, or the like. Alternatively, the functional layer 270 may be a layer formed from a part or portion of the inner surfaces 241 by changing a surface property of at least one of the inner surfaces 241 through chemical treatment.

For example, the functional layer 270 may be formed by coating a fluorine compound, a material of an alkyl group $(C_nH_{2n+1})$, or a material of a phenyl group $(C_6H_5)$, or formed by coating a graphene oxide composite material with a hydrophobic nano size or polypyrrole on a surface of at least one of the inner surfaces 241 of the cell 240. In the latter case, a porous structure may be formed on the surface of the one of the inner surfaces 241 of the cell 240.

Meanwhile, the functional layer 270 may include the protrusion part described above. That is, the functional layer 270 may include a protrusion part protruding therefrom to an inside of the cell 240. The protrusion part formed on the functional layer 270 may include one protrusion, or two or more protrusions, and the protrusions may be formed in various shapes and pitches. Alternatively, the functional layer 270 may be provided on one surface of the inner surfaces 241 of the cell 240 on which the protrusion part 260 is formed.

In addition, the protrusion part 260 formed on the functional layer 270 may be made of a material the same as a material defining the functional layer 270. Here, the protrusion part 260 formed on the functional layer 270 may be formed by photolithography or the chemical treatment described above.

As a contract area forming a contact force with the semiconductor light-emitting device 150 is reduced by the protrusion part 260, the contact force can be adjusted. As the functional layer 270 is made of a material having a smaller contract force than the material defining the inner surfaces 241 of the cell 240 with respect to the semiconductor light-emitting device 150, the contact force between the semiconductor light-emitting device 150 and the assembly substrate 200 can be minimized.

Hereinafter, a display manufacturing method using the assembly substrate 200 according to the present disclosure will be briefly described.

According to the present disclosure, a display device including the assembly substrate 200 with the aforementioned structure may be manufactured by the conventional method for manufacturing a display device using the self-assembly.

In detail, a method for manufacturing a display device according to the present disclosure may include the steps of moving the assembly substrate 200 having the above-described structure to an assembly position, putting a plurality of semiconductor light-emitting devices 150 including magnetic materials into a fluid chamber, applying a magnetic force to the semiconductor light-emitting devices 150 put into the fluid chamber to cause the semiconductor light-emitting devices 150 to move along one direction, applying an electric field to guide the semiconductor light-emitting devices 150 to predetermined positions while moving such that the semiconductor light emitting-devices 150 can be placed at the predetermined positions of the assembly substrate 200, transferring the semiconductor light emitting-devices 150 placed at the predetermined positions of the assembly substrate 200 to a transfer substrate 400, and transferring the semiconductor light-emitting devices 150 to a final substrate in which wiring is formed.

During the transfer process, a transfer substrate 400 having protrusion portions formed on one surface thereof in contact with the assembly substrate 200 may be used. Here, the transfer of the semiconductor light-emitting devices 150 to the transfer substrate 400 may be carried out by aligning the protrusion portions formed on the transfer substrate 400 and the semiconductor light-emitting devices 150 placed on the assembly substrate 200 to overlap each other, and then pressing the transfer substrate 400 onto the assembly substrate 200. A shape of the protrusion portion formed on the transfer substrate 400 is not particularly limited as long as it protrudes toward the assembly substrate 200.

The assembly substrate 200 used for the manufacturing method may include a protrusion part 260 or a functional layer 270 to minimize a contact force between the semiconductor light-emitting device 150 placed into the cell 240 and the assembly substrate 200.

In detail, the assembly substrate 200 may include the protrusion part 260 protruding inward (to an inside of the cell) from at least one of inner surfaces 241 of the cell 240, or the functional layer 270 made of a material having a smaller contact force than a material defining the inner surfaces 241 of the cell 240 with respect to the semiconductor light-emitting device 150.

According to this structure of the assembly substrate 200, a contact area between the semiconductor light-emitting devices 150 and the assembly substrate 200 can be reduced by the protrusion part 260, or energy acting on a contact surface between the semiconductor light-emitting devices 150 and the assembly substrate 200 can be reduced by the functional layer 270, thereby reducing a contact force between the assembly substrate 200 and the semiconductor light-emitting devices 150. Thus, the transfer rate of the semiconductor light-emitting devices 150 to the transfer substrate 400 can be increased.

The present discourse is not limited to the configuration and the method of the implementations described above, but the implementations may be configured such that all or some of the implementations are selectively combined so that various modifications can be made.

The invention claimed is:

1. An assembly substrate used in a display manufacturing method for placing semiconductor light-emitting devices to predetermined positions thereof using an electric field and a magnetic field, the assembly substrate comprising:

a base part;

a plurality of assembly electrodes extending in one direction and disposed in parallel on the base part;

a dielectric layer disposed on the base part to cover the plurality of assembly electrodes; and partition walls disposed on the dielectric layer and defining cells at predetermined intervals along the one direction of the plurality of assembly electrodes so as to overlap portions of the plurality of assembly electrodes, and the semiconductor light-emitting devices being placed into the cells, respectively, wherein, a plurality of protrusions protrude inward from at least one of inner surfaces of each of the cells, each of the cells is configured to accommodate a single semiconductor light-emitting device, and the single semiconductor light-emitting device accommodated in each of the cells is in contact with the plurality of protrusions formed on the at least one of inner surfaces of each of the cells.

2. The assembly substrate of claim 1, wherein the plurality of protrusions are formed on at least an upper surface of the dielectric layer among the inner surfaces of each of the cells.

3. The assembly substrate of claim 1, wherein the plurality of protrusions are made of a material the same as a material defining the inner surfaces of each of the cells on which the plurality of protrusions are formed.

4. The assembly substrate of claim 1, wherein the plurality of protrusions are made of a material having a smaller contact force than a material defining the inner surfaces of each of the cells on which the plurality of protrusions are formed with respect to the semiconductor light-emitting devices.

5. An assembly substrate used in a display manufacturing method for placing semiconductor light-emitting devices to predetermined positions thereof using an electric field and a magnetic field, the assembly substrate comprising,
a base part;
a plurality of assembly electrodes extending in one direction and disposed in parallel on the base part;
a dielectric layer disposed on the base part to cover the plurality of assembly electrodes; and
partition walls disposed on the dielectric layer and defining cells at predetermined intervals along the one direction of the plurality of assembly electrodes so as to overlap portions of the plurality of assembly electrodes, and the semiconductor light-emitting devices being placed into the cells, respectively;
wherein at least one of inner surfaces of each of the cells includes a functional layer made of a material having a smaller contact force than a material defining the inner surfaces of each of the cells with respect to the semiconductor light-emitting devices, and
wherein the functional layer is formed by coating a fluorine compound, a material of an alkyl group ($CnH_{2n+1}$), or a material of a phenyl group ($C_6H_5$), or formed by coating a graphene oxide composite material with a hydrophobic nano size or polypyrrole on a surface of at least one of the inner surfaces of each of the cells.

6. The assembly substrate of claim 5, wherein the functional layer is formed on at least an upper surface of the dielectric layer among the inner surfaces of each of the cells.

7. The assembly substrate of claim 5, wherein the functional layer includes a protrusion part protruding therefrom to an inside of each of the cells.

8. The assembly substrate of claim 7, wherein the protrusion part is made a material the same as a material defining the functional layer on which the protrusion part is formed.

9. The assembly substrate of claim 5, wherein a protrusion part protrudes inward from at least one of the inner surfaces of each of the cells, and
wherein the functional layer is formed on the protrusion part.

10. A method for manufacturing a device using the assembly substrate of claim 1, the method comprising:
moving the assembly substrate to an assembly position and putting the semiconductor light-emitting devices including magnetic materials into a fluid chamber;
applying a magnetic force to the semiconductor light-emitting devices put into the fluid chamber to cause the semiconductor light-emitting devices to move in the one direction;
applying an electric field to the semiconductor light-emitting devices to guide the semiconductor light-emitting devices to the predetermined positions while moving in the one direction, such that the semiconductor light-emitting devices are placed at the predetermined positions of the assembly substrate, respectively;
transferring the semiconductor light-emitting devices placed at the predetermined positions to a transfer substrate; and
transferring the semiconductor light-emitting devices on the transfer substrate to a final substrate having a wiring,
wherein the semiconductor light-emitting devices are placed into cells on the assembly substrate, respectively,
wherein each of the cells includes a plurality of protrusions protruding inward from the at least one of inner surfaces thereof, and a functional layer made of a material having a smaller contact force than a material defining the inner surfaces of the cells with respect to the semiconductor light-emitting devices,
wherein each of the cells is configured to accommodate a single semiconductor light-emitting device, and
the single semiconductor light-emitting device accommodated in each of the cells is in contact with the plurality of protrusions formed on the at least one of inner surfaces of each of the cells.

11. The assembly substrate of claim 1, wherein each of the cells includes a first area overlapping the plurality of assembly electrodes, and a second area between the plurality of assembly electrodes, and
wherein the plurality of protrusions are located in at least one of the first area and the second area.

12. The assembly substrate of claim 11, wherein the plurality of protrusions are not located in the second area.

13. The assembly substrate of claim 11, wherein the plurality of protrusions extend from the first area into the second area.

14. The assembly substrate of claim 11,
wherein the plurality of protrusions are separated from each other, and arranged symmetrically in each of the cells.

15. The assembly substrate of claim 11, wherein the plurality of protrusions are arranged parallel in the one direction.

16. An assembly board to seat semiconductor light emitting diodes at preset positions on the assembly board, the assembly board comprising:
a plurality of assembly electrodes extending in one direction at predetermined intervals;
a dielectric layer to cover the plurality of assembly electrodes;
partition walls on the dielectric layer and defining cells at the preset positions; and
a plurality of protrusions extending from a surface of the dielectric layer each of the cells,
wherein the plurality of protrusions expose a portion of the surface of the dielectric layer,
wherein each of the cells is configured to accommodate a single semiconductor light-emitting device, and
wherein the single semiconductor light-emitting device accommodated in each of the cells is in contact with the plurality of protrusions extended from the surface of the dielectric layer in each of the cells.

17. The assembly board of claim 16, wherein each of the cells includes a first area overlapping the plurality of assembly electrodes, and a second area between the plurality of assembly electrodes, and
wherein the plurality of protrusions are located in at least one of the first area and the second area.

18. The assembly board of claim 17, wherein the plurality of protrusions are not located in the second area.

19. The assembly substrate of claim 1, wherein the plurality of substrates are arranged to extend in a direction different from the one direction.

* * * * *